United States Patent [19]

Mahoney et al.

[11] Patent Number: 5,494,943
[45] Date of Patent: * Feb. 27, 1996

[54] STABILIZED CATIONICALLY-CURABLE COMPOSITIONS

[75] Inventors: Wayne S. Mahoney; Michael C. Palazzotto, both of St. Paul, Minn.

[73] Assignee: Minnesota Mining and Manufacturing Company, St. Paul, Minn.

[*] Notice: The portion of the term of this patent subsequent to Nov. 8, 2011, has been disclaimed.

[21] Appl. No.: 78,738

[22] Filed: Jun. 16, 1993

[51] Int. Cl.$^6$ .................................................. C08F 2/46
[52] U.S. Cl. .................................. 522/66; 522/18; 522/29; 522/170; 427/510; 428/413; 428/345; 428/355
[58] Field of Search .................................. 522/66, 18, 29, 522/170; 427/510; 428/413

[56] References Cited

U.S. PATENT DOCUMENTS

| | | | |
|---|---|---|---|
| 3,816,280 | 6/1974 | Watt | 204/159.11 |
| 4,503,211 | 3/1985 | Robins | 528/92 |
| 4,707,432 | 11/1987 | Gatechair et al. | 522/29 |
| 4,751,138 | 6/1988 | Tumey et al. | 428/323 |
| 4,846,905 | 7/1989 | Tarbutton et al. | 525/65 |
| 4,920,182 | 4/1990 | Manser et al. | 525/438 |
| 4,985,340 | 1/1991 | Palazzotto et al. | 522/25 |
| 5,047,376 | 9/1991 | Baumann et al. | 502/5 |
| 5,073,476 | 12/1991 | Meier et al. | 430/280 |
| 5,089,536 | 2/1992 | Palazzotto et al. | 522/16 |
| 5,130,406 | 7/1992 | Müller et al. | 528/92 |
| 5,179,179 | 1/1993 | Müller et al. | 526/90 |
| 5,191,101 | 3/1993 | Palazzotto et al. | 556/47 |
| 5,252,694 | 10/1993 | Willett et al. | 522/13 |
| 5,296,567 | 3/1994 | Baumann et al. | 526/172 |
| 5,362,421 | 11/1994 | Kropp et al. | 252/512 |

FOREIGN PATENT DOCUMENTS

| | | |
|---|---|---|
| 38551/85 | 8/1985 | Australia . |
| 1277070 | 11/1990 | Canada . |
| 2040010 | 10/1991 | Canada . |
| 0511405A1 | 11/1992 | European Pat. Off. . |
| 1404242 | 8/1975 | United Kingdom . |

OTHER PUBLICATIONS

Rabek, et al., Polymer 1992, 33, 4838–4844, 1992.

*Primary Examiner*—Mark Chapman
*Attorney, Agent, or Firm*—Gary L. Griswold; Walter N. Kirn; Lorraine R. Sherman

[57] ABSTRACT

The present invention provides an energy polymerizable composition comprising at least one epoxy monomer or at least one vinyl ether monomer and an initiation system therefor, the initiation system comprising at least one organometallic complex salt and at least one stabilizing additive. The cured composition provides useful articles or coated articles.

25 Claims, No Drawings

STABILIZED CATIONICALLY-CURABLE COMPOSITIONS

FIELD OF THE INVENTION

This invention relates to energy-polymerizable compositions comprising a cationically curable monomer and, as two-component initiator, at least one organometallic complex salt and at least one stabilizing additive, and a method for curing the compositions. This invention also relates to preparing articles comprising the cured compositions. The compositions are useful as molded articles, as coating compositions including abrasion resistant coatings, as adhesives including structural adhesives, and as binders for abrasives and magnetic media.

BACKGROUND OF THE INVENTION

Epoxides, i.e., organic compounds having one or more terminal or pendant oxirane (epoxy) groups, have been widely used for many years in adhesive compositions. These compounds are commonly cured, or caused to harden, by the addition of a curing or hardening agent. Many epoxy compositions use curing agents that begin to act immediately, or after a short period of time, even at room temperature or lower. These two-part compositions require that the epoxide and the curing agent be stored separately and only mixed immediately before use. A one-part composition has inherent shelf-life stability problems.

In many applications, it is desirable for a mixed two-part composition to be stable for a period of days, weeks, or months so that large batches can be prepared to be used as needed. Various attempts have been made to prolong "pot life" prior to cure of curable epoxy compositions. This allows the epoxide and curing agent to be mixed and stored before use as a one-part that is curable upon heating. Generally, it has been found that any increase in pot-life of epoxy compositions results in a corresponding sacrifice of cure speed. Additionally, achieving complete reaction, i.e., where all the epoxide functional groups are consumed, may require longer cure times and/or higher cure temperatures.

Various publications disclosing the preparation and/or use of curing agents for epoxy resins and/or other curable compositions are discussed below.

European Patent Application 0 511 405A1 teaches the use of onium salts having a nucleophilic pair anion, such as halogenide, perchlorate, alkylsulfate, arylsulfonate, as stabilizers for the polymerization of cationically polymerizable organic compositions, catalyzed by (n6-arene)(n$^5$-cyclopentadienyl)iron(+1) salt cationic photoinitiators. The pair anion of the onium salt attacks a growing terminal of the polymerization reaction during the curing of the composition leading to rapid termination.

U.S. Pat. Nos. 5,130,406 and 5,179,179 disclose cationic initiators containing oxygenated sigma-donor ligands. Such initiators suffer from their high hygroscopicity (moisture sensitivity); additionally, these initiators provide very little work time because they must be mixed with the epoxide at low temperatures.

Iron-arene salt cationic photoinitiators have been shown to effect the polymerization of pyrrole in the presence of oxygen. (Rabek, et al. Polymer 1992, 33, 4838–4844.) This polymerization proceeds through proton and hydrogen atom abstraction catalyzed by Fe(III). The polymerization was completely inhibited in the presence of 1,10-phenanthroline.

U.S. Pat. No. 4,920,182 discloses the use of a photoactivated bis-arene Fe complex that initiates copolymerization of epoxy- and carboxyl-terminated polyesters after exposure to light and subsequent heating. There is, however, no indication of the degree of either pot-life before, or latency, after, photoactivation as well as the speed of cure and its relation to pot-life and latency.

U.S. Pat. No. 4,846,905 describes the use of an acid/amine complex as a catalyst for copolymerizing epoxides and polyols. While excellent utility as a structural adhesive for bonding oily galvanized steel is shown, this particular catalyst system sacrifices pot-life to achieve rapid cure at low to moderate temperatures.

U.S. Pat. No. 4,751,138 teaches a coated abrasive article prepared by polymerizing a combination of epoxy and acrylate monomers using a combination of photoinitiators which can be cationic organometallic salts, onium salts, or thermally active Lewis acids such as antimony pentafluoride. Stabilization of the Lewis acids by the addition of amines is taught.

Australian Patent Application 38551/85 describes a hardenable composition consisting of a) a material polymerizable by cationic or free radical polymerization b) an iron (II)-η$^6$-benzene-η$^5$ -cyclopentadienyl complex salt, c) a sensitizer, and with certain monomers d) an electron acceptor. The electron acceptors are preferably an organic hydroperoxide, an organic peracid or a quinone.

U.S. Pat. No. 5,073,476 teaches the combination of iron(II) aromatic complexes mixed with electron acceptors for the polymerization by irradiation of organic materials which can be polymerized cationically and/or by free radicals. Nonspecific reference is made to methods to increase the capacity of the compositions to be stored in the dark by the addition of weak organic bases which are broadly stated to be nitriles, amides, lactones or urea derivatives.

U.S. Pat. No. 5,089,536 disclose curable compositions comprising an ionic salt of an organometallic complex cation and a cationically curable monomer. Novel compounds disclosed therein are claimed in U.S. Pat. No. 5,191,101. There is no teaching as to how to increase the shelf life or pot-life of a cationically curable composition.

Canadian Patent Application 2,040,010 relates to epoxy resin compositions comprising iron-arene complexes and specific primary amines or bipyridines as inhibitors. The epoxy containing compositions require light activation to cure.

U.S. Pat. No. 4,503,211 teaches that a latently curable epoxy resin composition including a novel curing agent comprising the liquid salt of a substituted pentafluoroantimonic acid and an aromatic amine has long pot life yet cures rapidly when heated.

U.S. Pat. No. 5,047,376 teaches the activation of organic cationically polymerizable materials through the use of a dispersion or a solution of an iron/arene salt and a polycarboxylic acid, an anhydride based on a polycarboxylic acid, or a polyisocyanate, by heating or with actinic irradiation. They teach increased shelf life using these compositions.

A conductive metal-containing adhesive is disclosed in Canadian Patent No. 1,277,070. Organic solvents useful to make coatable compositions are disclosed and include certain sulfoxides, sulfones, carboxylates, and lactones.

SUMMARY OF THE INVENTION

Briefly, in one aspect, this invention provides an energy polymerizable composition comprising:

(a) at least one cationically curable monomer selected from the group consisting of epoxy monomers and vinyl ether-containing monomers;

(b) a two-component initiator comprising:
  (1) at least one salt of an organometallic complex cation, and
  (2) at least one stabilizing additive; and (c) optionally, at least one of an alcohol containing material, an additive to increase the speed of cure, and additional adjuvants.

In a further aspect, the invention provides a process for controlling the cure of a composition comprising the steps of:

(a) providing the curable composition of the invention as described above, (b) adding sufficient energy to the composition in the form of at least one of heat and light in any combination and order to cure the composition, wherein energy preferably is heat only.

In yet a further aspect, this invention provides an article comprising a substrate having on at least one surface thereof a layer of the composition of the invention. The article can be provided by a method comprising the steps:

(a) providing a substrate, (b) coating the substrate with an energy polymerizable composition comprising at least one epoxy monomer or vinyl ether monomer, and a two-component initiator system comprising at least one salt of an organometallic complex cation and at least one stabilizing additive, and optionally adjuvants; preferably the coating is provided by methods such as bar, knife, reverse roll, extrusion die, knurled roll, or spin coatings, or by spraying, brushing, and (c) supplying sufficient energy to the composition in the form of at least one of heat and light in any combination and order to cure the composition, preferably heat only is used.

As used in this application:

"energy-induced curing" means curing or polymerization by means of heat or electromagnetic radiation (ultraviolet, visible, or electron beam), or electromagnetic radiation in combination with thermal (infrared and heat) means, such that heat and light are used simultaneously, or in any sequence, for example, heat followed by light, light followed by heat followed by light; preferably thermal energy only is used;

"catalytically-effective amount" means a quantity sufficient to effect polymerization of the curable composition to a polymerized product at least to a degree to cause an increase in viscosity of the composition under the conditions specified;

"organometallic salt" means an ionic salt of an organometallic complex cation, wherein the cation contains at least one carbon atom of an organic group that is bonded to a metal atom of the transition metal series of the Periodic Table of Elements ("Basic Inorganic Chemistry" F. A. Cotton, G. Wilkinson, Wiley, 1976, p 497);

"initiator" and "catalyst" are used interchangeably and mean a substance that changes the speed of a chemical reaction;

"cationically curable monomer" means at least one epoxide and/or at least one vinyl ether containing material;

"polymerizable composition" as used herein means a mixture of the initiator system and the cationically curable monomer; alcohols, speed enhancers, and adjuvants optionally can be present;

"polymerize or cure" means to supply sufficient energy to a composition in the form of at least one of heat and light in any order or combination to alter the physical state of the composition, to make it transform from a fluid to less fluid state, to go from a tacky to a non-tacky state, to go from a soluble to insoluble state, or to decrease the amount of cationically polymerizable material by its consumption in a reaction;

"initiation system", "initiator system", or "two-component initiator" means at least one salt of an organometallic complex cation and at least one stabilizing additive, the system being capable of initiating cationic polymerization;

"stabilizing additive" means at least one of specified classes of compounds that moderate the cure of a composition of the invention;

"group" or "compound" or "ligand" means a chemical species that allows for substitution or which may be substituted by conventional substituents which do not interfere with the desired product, e.g., substituents can be alkyl, alkoxy, aryl, phenyl, halo (F, Cl, Br, I), cyano, nitro, etc., and "epoxy/polyol" and "catalyst/additive", etc., mean combinations of the substances on both sides of the slash ("/").

Applicants have recognized that the industry can benefit from a thermally-curable epoxy or vinyl ether-containing resin composition which has an extended pot life, preferably does not have to be activated by light, yet will cure rapidly over a broad temperature range (50°–200° C.) and will retain the desired physical properties as required by its intended use.

Applicants believe there is no teaching in the art to polymerization of epoxy or vinyl ether monomers using as initiator system a combination of cationic organometallic salts combined with the classes of stabilizers disclosed herein.

DETAILED DISCLOSURE OF THE PREFERRED EMBODIMENTS OF THE INVENTION

The present invention provides an energy polymerizable composition comprising at least one epoxy monomer or at least one vinyl ether monomer and an initiation system therefor, the initiation system comprising at least one organometallic complex salt and at least one stabilizing additive. The cured composition provides useful articles or coated articles.

Epoxy compounds that can be cured or polymerized by the processes of this invention, using a catalytically effective amount of an initiator system comprising an organometallic cation salt and a stabilizing additive, are those known to undergo cationic polymerization and include 1,2-, 1,3-, and 1,4-cyclic ethers (also designated as 1,2-, 1,3-, and 1,4-epoxides) and vinyl ethers.

See the "Encyclopedia of Polymer Science and Technology", 6, (1986), 322, for a description of suitable epoxy resins. In particular, cyclic ethers that are useful include the cycloaliphatic epoxies such as cyclohexene oxide and the ERL™ series type of resins available from Union Carbide, New York, N.Y., such as vinylcyclohexene oxide, vinylcyclohexene dioxide, 3,4-epoxycyclohexylmethyl-3,4-epoxycyclohexanecarboxylate, bis-(3,4-epoxycyclohexyl) adipate and 2-(3,4-epoxycylclohexyl-5,5-spiro-3,4-epoxy) cyclohexene-meta-dioxane; also included are the glycidyl ether type epoxy resins such as propylene oxide, epichlorohydrin, styrene oxide, glycidol, the Epon™ series type of epoxy resins available from Shell Chemical Co., Houston, Tex., including the diglycidyl either of bisphenol A and chain extended versions of this material such as Epon 828, Epon 1001, Epon 1004, Epon 1007, Epon 1009 and Epon 2002 or their equivalent from other manufacturers, dicyclopentadiene dioxide, epoxidized polybutadienes such as the Poly bd™ resins from Elf Atochem, Philadelphia, Pa., 1,4-butanediol diglycidyl ether, polyglycidyl ether of phenolformaldehyde, cresol or novolac resin and resorcinol diglycidyl ether.

The preferred epoxy resins include the ERL™ type of resins especially 3,4-epoxycyclohexylmethyl-3,4 -epoxycyclohexanecarboxylate, bis-(3,4-epoxycyclohexyl) adipate and 2-(3,4-epoxycylclohexyl-5,5-spiro-3,4 -epoxy) cyclohexene-meta-dioxane and the bisphenol A Epon™ type resins including 2,2-bis-[ p-(2,3-epoxypropoxy)phenylpropane and chain extended versions of this material. It is also within the scope of this invention to use a blend of more than one epoxy resin.

The vinyl ether containing monomers can be methyl vinyl ether, ethyl vinyl ether, tert-butyl vinyl ether, isobutyl vinyl ether, triethylene glycol divinyl ether (Rapicure™ DVE-3, available from GAF, Wayne, N.J.), 1,4 -cyclohexanedimethanol divinyl ether (Rapicure™ CHVE, GAF), and the VEctomer™ resins from Allied Signal, such as VEctomer 2010, VEctomer 2020, VEctomer 4010, and VEctomer 4020, or their equivalent from other manufacturers. It is within the scope of this invention to use a blend of more than one vinyl ether resin.

It is also possible within the scope of this invention to use one or more epoxy resins blended with one or more vinyl ether resins. The different kinds of resins can be present in any proportion.

Suitable salts of organometallic complex cations include, but are not limited to, those salts disclosed in U.S. Pat. No. 5,089,536, col. 2, line 48, to col. 16, line 10, which is incorporated herein by reference.

In the most preferred compositions of the invention, the organometallic complex salt of the initiator system is represented by the following formula:

wherein

M is selected from the group containing Cr, Ni, Mo, W, Mn, Tc, Re, Fe, Ru, Os, Co, Rh and Ir;

$L^1$ represents the same or different ligands contributing pi-electrons that can be selected from aromatic compounds and heterocyclic aromatic compounds, and capable of contributing six pi-electrons to the valence shell of M;

$L^2$ represents the same or different ligands contributing pi-electrons that can be selected from cyclopentadienyl and indenyl anion groups, and capable of contributing six pi-electrons to the valence shell of M;

q is an integer having a value of 1 or 2, the residual charge of the complex cation;

X is an anion selected from organic sulfonate anions and halogen-containing complex anions of a metal or metalloid;

y and z are integers having a value of zero, one, or two, provided that the sum of y and z is equal to 2; and n is an integer having a value of 1 or 2, the number of complex anions required to neutralize the charge q on the complex cation.

Ligands $L^1$ and $L^2$ are well known in the art of transition metal organometallic compounds.

Ligand $L^1$ is provided by any monomeric or polymeric compound having an accessible aromatic group regardless of the total molecular weight of the compound. By "accessible", it is meant that the compound (or precursor compound from which the accessible compound is prepared) bearing the unsaturated group is soluble in a reaction medium, such as an alcohol, e.g., methanol; a ketone, e.g., methyl ethyl ketone; an ester, e.g., amyl acetate; a halocarbon, e.g., trichloroethylene; an alkane, e.g., decalin; an aromatic hydrocarbon, e.g., anisole; an ether, e.g., tetrahydrofuran; or that the compound is divisible into very fine particles of high surface area so that the unsaturated group (that is, the aromatic group) is sufficiently close to the metal to form a pi-bond between that unsaturated group and M. By polymeric compound, is meant, as explained below, that the ligand can be a group on a Polymeric chain.

Illustrative of ligand $L^1$ are substituted and unsubstituted carbocyclic and heterocyclic aromatic ligands having up to 25 rings and up to 100 carbon atoms and up to 10 heteroatoms selected from nitrogen, sulfur, non-peroxidic oxygen, phosphorus, arsenic, selenium, boron, antimony, tellurium, silicon, germanium, and tin, such as, for example, $eta^6$-benzene, $eta^6$-mesitylene, $eta^6$-toluene, $eta^6$-p-xylene, $eta^6$-o-xylene, $eta^6$-m-xylene, $eta^6$-cumene, $eta^6$-durene, $eta^6$-pentamethylbenzene, $eta^6$-hexamethylbenzene, $eta^6$-fluorene, $eta^6$-naphthalene, $eta^6$-anthracene, $eta^6$-perylene, $eta^6$-chrysene, $eta^6$-pyrene, $eta^6$-triphenylmethane, $eta^6$-paracyclophane, and $eta^6$-carbazole. Other suitable aromatic compounds can be found by consulting any of many chemical handbooks.

Illustrative of ligand $L^2$ are ligands derived from the substituted and unsubstituted $eta^5$-cyclopentadienyl anion, for example, $eta^5$-cyclopentadienyl anion, $eta^5$-methylcyclopentadienyl anion, $eta^5$-pentamethylcyclopentadienyl anion, $eta^5$-trimethylsilylcyclopentadienyl anion, $eta^5$-trimethyltincyclopentadienyl anion, $eta^5$-triphenyltincyclopentadienyl anion, $eta^5$-triphenylsilylcyclopentadienyl anion, and $eta^5$-indenyl anion.

Each of the ligands $L^1$ and $L^2$ can be substituted by groups that do not interfere with the complexing action of the ligand to the metal atom or that do not reduce the solubility of the ligand to the extent that competing with the metal atom does not take place. Examples of substituting groups, all of which preferably have less than 30 carbon atoms and up to 10 hetero atoms selected from nitrogen, sulfur, non-peroxidic oxygen, phosphorus, arsenic, selenium, antimony, tellurium, silicon, germanium, tin, and boron, include hydrocarbyl groups such as methyl, ethyl, butyl, dodecyl, tetracosanyl, phenyl, benzyl, allyl, benzylidene, ethenyl, and ethynyl; cyclohydrocarbyl such as cyclohexyl; hydrocarbyloxy groups such as methoxy, butoxy, and phenoxy; hydrocarbylmercapto groups such as methylmercapto (thiomethoxy), phenylmercapto (thiophenoxy); hydrocarbyloxycarbonyl such as methoxycarbonyl and phenoxycarbonyl; hydrocarbylcarbonyl such as formyl, acetyl, and benzoyl; hydrocarbylcarbonyloxy such as acetoxy, and cyclohexanecarbonyloxy; hydrocarbylcarbonamido, for example, acetamido, benzamido; azo; boryl; halo, for example, chloro, iodo, bromo, and fluoro; hydroxy; cyano; nitro; nitroso; oxo; dimethylamino; diphenylphosphino; diphenylarsino; diphenylstibine; trimethylgermane; tributyltin; methylseleno; ethyltelluro; and trimethylsiloxy.

Ligands $L^1$ and $L^2$ independently can be a unit of a polymer. $L^1$ for example, can be the phenyl group in polystyrene, poly(αmethylstyrene) or polymethylphenylsiloxane; or the carbazole group in polyvinylcarbazole $L^2$ for example, can be the cyclopentadiene group in poly(vinylcyclopentadiene). Polymers having a weight average molecular weight up to 1,000,000 or more can be used. It is preferable that 5 to 50% of the aromatic groups present in the polymer be complexed with metallic cations.

Suitable anions, X, in formula I, for use as the counterion in the ionic salts of the organometallic complex cation in the coating compositions are those in which X can be represented by the formula $$DQ_r \qquad (II)$$

wherein

D is a metal from Groups IB to VIIB and VIII or a metal or metalloid from Groups IIIA to VA of the Periodic Table of Elements (CAS notation), Q is a halogen atom, hydroxyl group, a phenyl group, or an alkyl group, and r is an integer having a value of 1 to 6.

Preferably, the metals are copper, zinc, titanium, vanadium, chromium, manganese, iron, cobalt, or nickel and the metalloids preferably are boron, aluminum, antimony, tin, arsenic, and phosphorus. Preferably, the halogen atom, Q, is chlorine or fluorine. Illustrative of suitable anions are B(phenyl)$_4^-$, B(phenyl)$_3$(alkyl)$^-$, where alkyl can be ethyl, propyl, butyl, hexyl and the like, $BF_4^-$, $PF_6^-$, $AsF_6^-$, $SbF_6^-$, $FeCl_4^-$, $SnCl_5^-$, $SbF_5OH^-$, $AlCl_4^-$, $AlF_6^-$, $GaCl_4^-$, $InF_4^-$, $TiF_6^-$, $ZrF_6^-$, etc.

Additional suitable anions, X, in formula I, of use as the counterion in the ionic salts of the organometallic complex cations include those in which X is an organic sulfonate. Illustrative of suitable sulfonate-containing anions are $CH_3SO_3^-$, $CF_3SO_3^-$, $C_6H_5SO_3^-$, p-toluenesulfonate, p-chlorobenzenesulfonate and related isomers. Preferably, the anions are $BF_4^-$, $PF_6^-$, $SbF_6^-$, $SbF_5OH^-$, $AsF_6^-$, $SbCl_6^-$, and $CF_3SO_3^-$.

Organometallic salts are known in the art and can be prepared as disclosed in, for example, EPO Nos. 094,914, 094,915, 126,712, and U.S. Pat. Nos. 5,089,536, 5,059,701, 5,191,101, which are incorporated herein by reference for the disclosure of organometallic salts and their preparation. Also, disubstituted ferrocene derivatives can be prepared by the general procedure described in *J. Amer. Chem, Soc.*, 1978, 100, 7264. Ferrocene derivatives can be oxidized to prepare the corresponding ferrocenium salts by the procedure described in *Inorg. Chem.*, 1971, 10, 1559.

The preferred salts of organometallic complex cations useful in the compositions of the invention are derived from formula I where $L^1$ is chosen from the class of aromatic compounds, preferably based on benzene, and $L^2$ is chosen from the class of compounds containing a cyclopentadienyl anion group, M is Fe and X is selected from the group consisting of tetrafluoroborate, hexafluorophosphate, hexafluoroarsenate, hexafluoroantimonate, hydroxypentafluoroantimonate or trifluoromethanesulfonate. The most preferred salts of the organometallic complex cations useful in the invention are included in formula I where only $L^1$ or only $L^2$ is present, M is Fe and X is selected from the group consisting of tetrafluoroborate, hexafluorophosphate, hexafluoroarsenate, hexafluoroantimonate, hydroxypentafluoroantimonate, or trifluoromethanesulfonate. The organometallic complex cations can be used as mixtures and isomeric mixtures.

In the preferred compositions of the invention, salts of the organometallic complex cation include those disclosed in U.S. Pat. No. 5,089,536.

Examples of the preferred salts of organometallic complex cations useful in preparing the compositions of the invention include the following:

bis-(eta$^6$-benzene)iron(2+) hexafluoroantimonate bis-(eta$^6$-cumene)iron(2+) hexafluoroantimonate bis-(eta$^6$-durene)iron(2+) hexafluoroantimonate bis-(eta$^6$-p-xylene)iron(2+) hexafluoroantimonate bis-(eta$^6$-mesitylene)iron, (2+) trifluoromethanesulfonate bis-(eta$^6$-mesitylene)iron (2+) hexafluoroantimonate bis-(eta$^6$-hexamethylbenzene)iron (2+) hexafluoroantimonate bis-(eta$^6$-pentamethylbenzene)iron (2+) hexafluoroantimonate bis-(eta$^6$-naphthalene)iron (2+) hexafluoroantimonate bis-(eta$^6$-pyrene)iron (2+) hexafluoroantimonate (eta$^6$-naphthalene) (eta$^5$-cyclopentadienyl) iron(1+) hexafluoroantimonate (eta$^6$-pyrene)(eta$^5$-cyclopentadienyl)iron (1+) hexafluoroantimonate (eta$^6$-chrysene)(eta$^5$-cyclopentadienyl)iron (1+) hexafluoroantimonate (eta$^6$-perylene) (eta$^5$-cyclopentadienyl) iron(1+) hexafluoroantimonate (eta$^6$-naphthalene)(eta$^5$-cyclopentadienyl)iron (1+) trifluoromethanesulfonate (eta$^6$-pyrene) (eta$^5$-cyclopentadienyl) iron(1+) trifluoromethanesulfonate bis-(eta$^5$-pentamethylcyclopentadienyl)iron (1+) hexafluoroantimonate bis-(eta$^5$-methylcyclopentadienyl)iron (1+) hexafluoroantimonate bis-(eta$^5$-trimethylsilylcyclopentadienyl)iron (1+) hexafluoroantimonate bis-(eta$^5$-triphenyltincyclopentadienyl)iron (1+) hexafluoroantimonate bis-(eta$^5$-indenyl)iron(1+) hexafluoroantimonate (eta$^5$-cyclopentadienyl)(eta$^5$-methylcyclopentadienyl)iron (1+) hexafluoroantimonate bis-(eta$^5$-cyclopentadienyl)iron(1+) trifluoromethanesulfonate bis-(eta$^5$-trimethylsilylcyclopentadienyl)iron(1+) trifluoromethanesulfonate bis-(eta$^5$-triphenyltincyclopentadienyl)iron(1+) trifluoromethanesulfonate bis-(eta$^5$-cyclopentadienyl)iron(1+) hexafluoroantimonate.

Stabilizing additives of the present invention can be selected from five classes of materials. The active portions of these materials (see formulae III to VIII which can be converted to an active portion by replacement, for example, of a hydrogen atom by a bonding site), can be part of a polymer or included as part of any component in the compositions of the invention.

Class 1 is described by the formula III $$R^1-Z^1-R^1 \qquad (III)$$

where $Z^1$ is a diradical moiety selected from the group consisting of

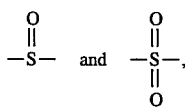

and each $R^1$ is a radical moiety which can be independently selected from $C_1$ to $C_{10}$ substituted and unsubstituted alkyl groups, and groups of one to four substituted or unsubstituted aromatic rings wherein two to four rings can be fused or unfused, and the $R^1$s taken together can form a heterocyclic ring having 5 to 7 ring atoms. Examples of substituting groups which can be present in any $R^1$ group, all of which preferably have less than 30 carbon atoms and up to 10 hetero atoms wherein heteroatoms can interrupt carbon chains to form, for example, ether, thio, or amino linkages selected from nitrogen, sulfur, non-peroxidic oxygen, phosphorus, arsenic, selenium, antimony, tellurium, silicon, germanium, tin, and boron, include hydrocarbyl groups such as methyl, ethyl, butyl, dodecyl, tetracosanyl, phenyl, benzyl, allyl, benzylidene, ethenyl, and ethynyl; cyclohydrocarbyl groups such as cyclohexyl; hydrocarbyloxy groups such as methoxy, butoxy, and phenoxy; hydrocarbylmercapto groups such as methylmercapto (thiomethoxy), phenylmercapto (thiophenoxy); hydrocarbyloxycarbonyl such as methoxycarbonyl and phenoxycarbonyl; hydrocarbylcarbonyl such as formyl, acetyl, and benzoyl; hydrocarbylcarbonyloxy such as acetoxy, and cyclohexanecarbonyloxy; hydrocarbylcarbonamido, for example, acetamido, benzamido; azo; boryl; halo, for example, chloro, iodo, bromo, and fluoro; hydroxy; cyano; nitro; nitroso; oxo; dimethylamino; diphenylphosphino; diphenylarsino; diphenylstibine; trimethylgermane; tributyltin; methylseleno; ethyltelluro; trimethylsiloxy; and aromatic groups such as cyclopentadienyl, phenyl, naphthyl and indenyl.

Class 1 stabilizers are particularly useful with bis-eta$^6$-arene type organometallic salts and can be present in an amount in the range of 0.1 to 5.0 weight percent, preferably 0.1 to 3.0 weight percent of the total composition.

Class 2 comprises macrocyclic compounds described by formula IV

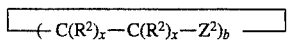 (IV)

wherein $Z^2$ is a diradical and can be —O—, —S—, or —NH—; wherein each $R^2$ independently can be hydrogen or it can be $R^1$ as previously defined, or two $R^2$s together can form at least one ring which is saturated or unsaturated and the ring can be substituted or unsubstituted with alkyl, alkenyl or alkynyl groups containing from 1 to 30 carbon atoms; the carbon atoms can be interrupted with up to 10 individual, non-catenated heteroatoms selected from O, S, and N; x can be 1 or 2, and bis an integer from 3 to 10.

Included in formula IV are macrocyclic complexes containing oxygen, generally known as crown ethers (De Jong, F. et al. Adv. Org. Chem. 1980, 17, 279–433; Gokel, G. W. et al. Aldrichimica Acta, 1976, 9, 3–12.). In addition to oxygen, these macrocycles may also contain any combination of nitrogen or sulfur atoms. Cryptands, which are bicyclic and cycles of higher order may also be used. Examples of suitable crown ethers and cryptands are 15-crown-5, 12-crown-4, 18-crown-6, 21-crown-7, dibenzo-18-crown-6, dicyclohexyl- 18-crown-6, benzo-15-crown-5, Kryptofix™ 21, Kryptofix 211, Kryptofix 222, Kryptofix 222B, all available from Aldrich Chemical Company, Milwaukee, Wis. The preferred crown ether of this invention is 15-crown-5 (1,4,7,10,13-pentaoxacyclopentadecane).

Class 3 is represented by formulae V and VI:

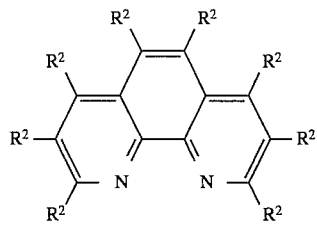 (V)

wherein each $R^2$ has the same definition as in formula IV. Examples of this class of stabilizer include unsubstituted and substituted phenanthroline compounds, the most common substituents being alkyl groups having 1 to 20 carbon atoms, the preferred phenanthroline being 1,10-phenanthroline; oxygen is not required in this stabilization; and

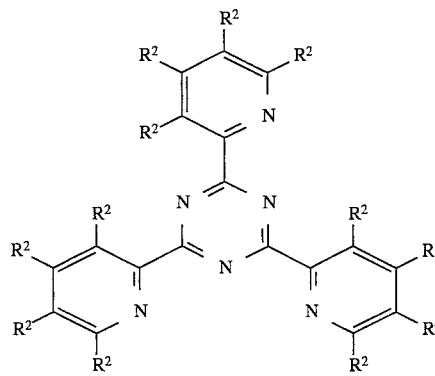 (VI)

a class of tripyridyltriazines, wherein each $R^2$ has the same definition as in formula IV, with the preferred being 2,4,6-tripyridyltriazine.

Class 4 is described by formula VII:

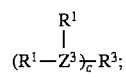 (VII)

wherein $Z^3$ is nitrogen, phosphorus, arsenic or antimony; c can be 1 or 2;
wherein $R^1$ has the same definition as in formula I and $R^3$ can be $R^1$ or a difunctional group (as when c=2) selected from alkylene (having 3 to 10 carbon atoms) and phenylene groups.

Examples of suitable stabilizing additives include, but are not limited to trialkyl, tricycloalkyl, tri(alkylcycloalkyl), triaryl, and trialkaryl amines, phosphines, phosphine oxides, phosphites, arsines, and stibines, including triphenylphosphine, triphenylstibene, triphenylarsine, tricyclohexylphosphine, tributylphosphine, tripropylphosphine, triethylphosphine, trimethylphosphine, triisopropylphosphine, triisopropylphosphite, tributylphosphite, triphenylphosphite, triethylamine, tripropylamine, tributylamine, and chelating phosphines such as diphenylphosphinomethane, diphenylphosphinoethane, diphenylphosphinopropane. Other suitable tertiary amines are listed in U.S. Pat. No. 4,503,211 and incorporated by reference especially diethyl-o-toluidine. The preferred stabilizers from Class 4 include compounds such as triarylphosphines, triarylstibines and substituted and unsubstittued dialkylaryl tertiary amines.

Class 5 is described by formula VIII:

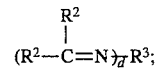 (VIII)

wherein $R^3$ and each $R^2$ are as previously defined; and wherein d is 1 or 2. These stabilizers are chosen from the general type of compounds known as Schiff base derivatives and are generally made by the condensation of a ketone or aldehyde with a primary amine. They can be prepared by the general methods described in U.S. Pat. No. 4,909,954, which methods are incorporated herein by reference. In preferred compounds d is 1, one $R^2$ is a substituted or unsubstituted phenyl group and the other $R^2$ is hydrogen, $R^3$ is a substituted or unsubstituted alkyl, phenyl or alkoxy group; or when d is 2, one $R^2$ is a phenyl group and the other $R^2$ is hydrogen, and $R^3$ is a diradical bridging alkylene or phenylene group.

The initiator system is present in a catalytically effective amount. Typically, the initiator system (two components) can be present in the range of 0.01 to 20% by weight, preferably 0.1 to 5% by weight of the total polymerizable composition. When a class 1 stabilizing additive is used, the mole ratio of the organometallic complex salt to the stabilizing additive is generally in the range of 1:5 to 1:30, preferably 1:6 to 1:25. For classes 2 to 5 of stabilizing additive, the mole ratio of the organometallic complex salt to the stabilizing additive is generally in the range of 1:10 to 10:1, preferably 1:5 to 5:1.

When it is desired to increase the rate of cure of the compositions of the invention, it can be useful to additionally include a cure rate enhancer such as a peroxide group, hydroperoxide (—OOH group), or acid-generating esters.

A description of useful peroxides can be found in the "Encyclopedia of Chemical Technology" 17, 1982, 1–90. Many useful peroxides are commercially available such as di-tert-butyl peroxide, di-tert-amyl peroxide, tert-butyl cumyl peroxide, tert-butyl perbenzoate, tert-amyl perbenzoate, 1,1-di-(tert-butylperoxy)- 3,5,5,-trimethylcyclohexane, dibenzoyl peroxide, dilauroyl peroxide, and n-butyl-4, 4-di-(tert-butylperoxy)-valerate.

Commercially available hydroperoxides include tertiary butyl hydroperoxide, cumene hydroperoxide, triphenylmethyl hydroperoxide, tetralin hydroperoxide, α-methyl tetralin hydroperoxide, tert-amyl hydroperoxide, decalin hydroperoxide, 2,5 -dihydroperoxy-2,5-dimethylhexane, p-methane hydroperoxide, diisopropylbenzene hydroperoxide. Ketone peroxides containing the hydroperoxy group are also useful and may include methyl ethyl ketone peroxide, methyl isobutyl ketone peroxide, cyclohexanone peroxide, and 2,4-pentanedione peroxide.

Acid-generating esters are described in U.S. Pat. No. 3,907,706 which is incorporated herein by reference for disclosure of these esters and their preparation.

Preferred esters can be prepared by an esterification reaction between oxalic acid and tertiary alkyl alcohols such as: t-butanol, 1,1 -dimethylpropanol, 1-methyl-2-ethylpropanol, 1,1 -dimethyl-n-butanol, 1,1-dimethyl-n-pentanol, 1,1 -dimethylisobutanol, 1,1,2,2-tetramethylpropanol, 1-methylcyclopentanol, 1-methylcyclohexanol, 1,1 -dimethyl-n-hexanol, 1,1-dimethyl-n-octanol, 1,1 -diphenylethanol, and 1,1-dibenzyl ethanol.

Typically the cure rate enhancers can be present in the range of 0.01 to 20 percent by weight, preferably 0.1 to 5 percent by weight of the total polymerizable composition.

When the resin contains an epoxy, it can also be preferred and within the scope of this invention to add mono- or poly-alcohols as tougheners to the epoxy curable composition. The alcohol or polyol aids in chain extension and preventing over-crosslinking of the epoxide during curing.

Representative mono-alcohols can include methanol, ethanol, 1-propanol, 2-propanol, 2-methyl-2-propanol, 1-butanol, 2-butanol, 1-pentanol, neopentyl alcohol, 3 -pentanol, 1-hexanol, 1-heptanol, 1-octanol, 2 -phenoxythanol, cyclopentanol, cyclohexanol, cyclohexylmethanol, 3-cyclohexyl-1-propanol, 2 -norbornanemethanol, and tetrahydrofurfuryl alcohol.

The polyols useful in the present invention have two to five, preferably two to four, hydroxyl groups. Examples of useful polyols include, but are not limited to, 1,2-ethanediol, 1,2-propanediol, 1,3-propanediol, 1,4-butanediol, 1,3-butanediol, 2-methyl-1,3 -propanediol, 2,2-dimethyl-1,3-propanediol, and 2-ethyl-1,6-hexanediol, 1,5-pentanediol, 1,6-hexanediol, 1,8-octanediol, neopentyl glycol, glycerol, trimethylolpropane, 1,2,6-hexanetriol, trimethylolethane, pentaerythritol, quinitol, mannitol, diethylene glycol, triethylene glycol, tetraethylene glycol, glycerine, 2-ethyl-2-(hydroxymethyl)-1,3 -propanediol, 2-ethyl-2-methyl-1,3-propanediol, pentaerythritol, 2-ethyl-1,3-pentanediol, and 2,2-oxydiethanol, sorbitol, 1,4-cyclohexane dimethanol, 1,4-benzene dimethanol, 2-butene-1,4-diol, and polyalkoxylated bis-phenol A derivatives. Other examples of useful polyols are disclosed in U.S. Pat. No. 4,503,211.

Higher molecular weight polyols include the polyethylene and polypropylene oxide polymers in the molecular weight range of 200 to 20,000 such as the Carbowax™ polyethyleneoxide materials supplied by Union Carbide, caprolactone polyols in the molecular weight range of 200 to 5,000, such as the Tone™ polyol materials supplied by Union Carbide, polytetramethylene ether glycol in the molecular weight range of 200 to 4,000, such as the Terathane™ materials supplied by Dupont (Wilmington, Del.), hydroxyl terminated polybutadiene resins such as the Poly bd™ supplied by Elf Atochem, or equivalent materials supplied by other manufacturers.

The alcohol functional component can be present as a mixture of materials and can contain mono- and poly-hydroxyl containing materials. The alcohol is preferably present in an amount sufficient to provide an epoxy to hydroxy ratio in the composition between about 1:0.1 and 1:1, more preferably between about 1:0.2 and 1:0.8, and most preferably between about 1:0.3 and 1:0.6.

A suitable initiation system that includes organometallic complex ionic salts described by formula I, and at least one stabilizing additive taken from Classes 1 through 5 contains those combinations that, upon application of sufficient energy generally in the form of heat and/or light will catalyze the polymerization of the compositions of the invention. The level of catalytic activity depends on various factors such as the choice of ligands and counterions in the organometallic salt and the selection of the at least one stabilizing additive.

Temperature of polymerization and amount of initiator system used will vary depending on the particular polymerizable composition used and the desired application of the polymerized product.

Solvents, preferably organic, can be used to assist in dissolution of the initiator system in the cationically polymerizable monomers, and as a processing aid. It may be advantageous to prepare a concentrated solution of the organometallic complex salt in a small amount solvent to simplify the preparation of the polymerizable composition. Useful solvents are lactones, such as gamma-butyrolactone, gamma-valerolactone; ketones such as acetone, methyl ethyl ketone, methyl isobutyl ketone, cyclopentanone and cyclohexanone; sulfones, such as tetramethylene sulfone, 3-methylsulfolane, 2,4-dimethylsulfolane, butadiene sulfone, methyl sulfone, ethyl sulfone, propyl sulfone, butyl sulfone, methyl vinyl sulfone, 2 -(methylsulfonyl)ethanol, 2,2'-sulfonyldiethanol; sulfoxides, such as dimethyl sulfoxide; cyclic carbonates such as propylene carbonate, ethylene carbonate and vinylene carbonate; carboxylic acid esters such as ethyl acetate, methyl cellosolve acetate, methyl formate; and other solvents such as methylene chloride, nitromethane, acetonitrile, glycol sulfite and 1,2-dimethoxyethane (glyme). In some applications, it may be advantageous to adsorb the initiator onto an inert support such as silica, alumina, clays, as described in U.S. Pat. No. 4,677,137, which is incorporated herein by reference.

Suitable sources of heat to cure the compositions of the invention include induction heating coils, ovens, hot plates, heat guns, IR sources including lasers, microwave sources, etc.

Suitable substrates useful to provide articles of the invention include, for example, metals (for example, aluminum, copper, cadmium, zinc, nickel, steel, iron, silver), glass, paper, wood, various thermoplastic or thermoset films (for example, polyethylene terephthalate, plasticized polyvinyl chloride, polypropylene, polyethylene), cloth, ceramics and cellulosics, such as cellulose acetate.

Adjuvants may optionally be added to the compositions such as colorants, abrasive granules, stabilizers, light stabilizers, antioxidants, flow agents, bodying agents, flatting agents, inert fillers, binders, blowing agents, fungicides, bactericides, surfactants, plasticizers, rubber tougheners and other additives known to those skilled in the art. They also can be substantially unreactive, such as fillers both inorganic and organic. These adjuvants, if present are added in an amount effective for their intended purpose.

Compositions of this invention are useful to provide abrasion-resistant or protective coatings to articles, as molded articles, as adhesives, including hot melt and structural adhesives, and as binders for abrasives.

In general, a composition's physical properties, i.e., hardness, stiffness, modulus, elongation, strength, etc., is determined by the choice of the epoxy resin, and if an alcohol containing material is used, the ratio of epoxy to alcohol and the nature of the alcohol. Depending on the particular use, each one of these physical properties of the system will have a particular optimum value. Generally, the cured material from a higher epoxy/alcohol ratio is stiffer than from a lower epoxy/alcohol ratio. Generally, for an epoxy/alcohol composition, a shorter chain polyol yields a cured composition that is stiffer than when using a longer chain polyol. The stiffness of a composition can also be increased by using a shorter chain monofunctional alcohol to replace a polyol. The speed of cure can be controlled by the choice of initiator system, its level, and the particular curable materials. Epoxy/alcohol mixtures generally cure faster than epoxy only compositions. Cycloaliphatic epoxies cure more rapidly than glycidyl ether epoxies. Mixtures of these two types of epoxies can be used adjust the cure rate to a desired level.

To prepare a coated abrasive article using the materials of the subject invention, abrasive particles must be added to the curable composition. The general procedure is to select a suitable substrate such as paper, cloth, polyester, etc., coat this substrate with the make coat which consists of the curable composition containing the abrasive particles, and then curing by the application of a source of energy. A size coat, which cures to a harder material than the make coat, is then coated over the make coat and cured. The size coat serves to lock the abrasive particles in place.

To prepare a structural/semi-structural adhesive, the curable composition could contain additional adjuvants such as silica fillers, glass bubbles and tougheners. These adjuvants add toughness to and reduce the density of the cured composition. Generally shorter chain polyols would be used to give toughness through chain extension of the cured epoxy. Too long a chain diol generally would produce too soft a cured composition that would not have the strength needed for structural/semi-structural applications. Using polyols having high hydroxyl functionality greater than three could produce an overcrosslinked material resulting in a brittle adhesive.

To prepare magnetic media using the materials of the subject invention, magnetic particles must be added to the curable composition. Magnetic media need to be coated onto a suitable substrate, generally a polymeric substrate like polyester. Generally the coatings are very thin so that sufficient carrier solvent must be added to allow the production of a suitably thin, even coating. The coating must cure rapidly so a fast initiator system and curable materials must be chosen. The cured composition must have a moderately high modulus so the curable materials must be selected appropriately.

To prepare a clear abrasion resistant coating from the materials of the subject invention, two important criteria for selecting the composition are clarity and toughness of the cured composition. Generally, particulant adjuvants would not be added since they would reduce the gloss and clarity of the cured composition. Optionally, pigments could be added to produce a colored film.

Molded articles are made by means known to those skilled in the art, as, for example, by reaction injection molding, casting, etc.

Objects and advantages of this invention are further illustrated by the following examples, but they should not be construed as limiting the invention; the scope of which is defined by the claims.

EXAMPLES

In the examples, all parts, ratios, and percents are by weight unless specifically indicated otherwise. All materials used are either known or commercially available unless otherwise indicated or apparent. All examples were prepared in ambient atmosphere (in the presence of usual amounts of oxygen and water vapor) unless indicated otherwise.

The general sample preparation procedure was as follows: the desired amount of stabilizing additive was mixed with the epoxy or vinyl ether containing composition; the composition was warmed if necessary to insure complete mixing of the components; the mixture was allowed to cool to room temperature (23° C.) before use. Curable mixtures were prepared by measuring out the desired amount of the cationic organometallic catalyst, and, if needed, adding the desired amount of solvent to dissolve the catalyst, then adding the epoxy or vinyl ether containing mixture and mixing thoroughly.

TEST METHODS

TENSILE TEST SAMPLE PREPARATION

Tensile test samples were prepared by using an ASTM 628-87 Type IV die to cut a mold out of 0.91 millimeter (mm) thick silicone rubber mold. A sandwich construction was prepared by first laying down on an aluminum panel a 0.025 micrometer (μm) polyester sheet coated with a conventional silicone release layer, release side up. The silicone rubber mold was placed on this layer. The polymerizable composition to be cured was applied to the mold. A second piece of release layer coated polyester, release side down, was placed over the mold and a rubber roller was used to smooth out the sample and eliminate air bubbles. The samples were cured with various temperature cycles as stated in the particular example. Using this procedure, reproducible samples were made for tensile tests.

TENSILE TESTING PROCEDURE

Tensile tests were conducted following the method described in ASTM 628-87 Tensile Testing Methods standard. The samples were tested at a strain rate of 5 mm/min. An Instron Model 1122 tensile tester was used for the tests. Ultimate tensile strength is reported in MPa and is the strength at break, percent elongation is reported in % using the crosshead movement as a measure of elongation, energy at break is reported in Newton-meters (N-m) and is the area under the stress-strain curve and modulus is reported in MPa and is the modulus at 3% elongation.

OVERLAP SHEAR TEST

Sheets of 0.76 mm thick G60 hot-dipped extra smooth galvanized steel, obtained from National Steel Corporation, Livonia, MI, were cut into 25.4 mm by 76.2 mm test coupons and degreased with acetone. Both coupons are allowed to dry for 30 minutes at about 22° C. The adhesive composition was spread over one end of the first coupon. The spacing distance, 0.254 mm, was maintained by the presence of glass microbeads in the adhesive mix. The other coupon was placed over the adhesive such that there was a 12.7 mm overlap of the coupons and with the uncoated ends of the coupons aligned in opposite directions from each other. The coupons were clamped together and cured at 170° C. for 30 minutes. The prepared samples were cooled for at least 1 hour at about 22° C. before testing. The lap shear was determined using a tensile tester according to ASTM Test Method D1002-72 with a crosshead speed of 5 cm/min. The lap shear strength was reported in megaPascals (MPa).

Differential Scanning Calorimetry (DSC)

Differential Scanning Calorimetry was used to measure the exothermic heat of reaction associated with the cure of the cationically polymerizable monomer. This energy is measured in Joule/gram (J/g). The exotherm profile, i.e. peak temperature, onset temperature, etc., of the exotherm provided information on conditions that are needed to cure the material. The integrated energy under an exothermic peak is related to the extent of cure. For a stable composition, more of that exotherm energy should remain with time indicating that the composition is not curing prematurely. For an unstable composition, the exotherm energy will decrease more rapidly with time indicating that the composition has undergone some degree of cure prematurely.

GLOSSARY
IDENTIFICATION OF COMPONENTS USED IN THE EXAMPLES

| | |
|---|---|
| ERL ™-4221 | 3,4-epoxycyclohexylmethyl-3,4-epoxy cyclohexanecarboxylate (ERL-4221 available from Union Carbide) |
| Epon ™ 828 | diglycidyl ether of bisphenol A (EPON 828 available from Shell Chemical Co.) |
| CHDM | 1,4-cyclohexanedimethanol |
| Paraloid ™ BTA IIIN2 brand copolymer | methyl methacrylate/butadiene/ styrene copolymer available from Rohm & Haas Company |
| Reactive Diluent WC68 ™ | diglycidyl ether of neopentyl glycol having an epoxy equivalent weight of about 135 available from Rhone-Poulenc |
| GP7I ™ silica | silicon dioxide having a particle size range from 20–30 micrometers available from Haribson Walker Corp. |
| Cab-O-Sil ™ TS720 ™ brand silica | fumed silica available from Cabot Corp. |
| B37/2000 ™ | glass bubbles, available from Minnesota Mining and Manufacturing Company |
| Catalysts | |
| $Cp_2FeSbF_6$ | bis-($\eta^5$-cyclopentadienyl)iron(+1) hexafluoroantimonate |
| $(MeCp)_2FeSbF_6$ | bis-($\eta^5$-methylcyclopentadienyl)- iron(+1) hexafluoroantimonate |
| $(Me_3SiCP)_2FeSbF_6$ | bis-($\eta^5$-trimethylsilylcyclopenta- dienyl)iron(+1)hexafluoro antimonate |
| $(Ph_3SnCp)_2FeSbF_6$ | bis-($\eta^5$-triphenyltincyclopenta- dienyl)iron(+1) hexafluoroantimonate |
| CpFeXylSbF_6 | ($\eta^6$-xylenes)($\eta^5$-cyclopentadienyl)- iron(+1) hexafluoroantimonate |
| Cp | cyclopentadienyl |
| Me | methyl |
| Ph | phenyl |
| Mes | mesitylene |

Stabilizing Additives (SA)

SA1: [phenyl-CH=N-phenyl]

SA2: [phenyl-CH=N-(CH2)5-CH3]

SA3: [phenyl-CH=N-CH2-CH2-N=CH-phenyl]

SA4: [Cl-phenyl-CH=N-CH2-CH2-N=CH-phenyl-Cl]

SA5: [H3C-phenyl-CH=N-phenyl-OCH3]

SA6: [CH3O-phenyl-CH=N-CH2-CH2-N=CH-phenyl-OCH3]

SA7: [OH-phenyl-CH=N-phenyl-CH3]

SA8: [CH3-phenyl-CH=N-(CH2)5-CH3]

SA9: [NC-phenyl-CH=N-CH2-CH2-N=CH-phenyl-CN]

-continued

Stabilizing Additives (SA)

| SA10 | 2-hydroxybenzylidene-4-methylaniline Schiff base |
| SA11 | 2-hydroxybenzylidene-aniline Schiff base |
| SA12 | 2-hydroxybenzylidene-4-(dimethylamino)aniline Schiff base |
| SA13 | 2-hydroxybenzylidene-4-(dimethylamino)aniline Schiff base (isomer) |
| SA14 | $P-(C_6H_5)_3$ |
| SA15 | $Sb-(C_6H_5)_3$ |
| SA16 | 2-chlorobenzylidene-aniline Schiff base |
| SA17 | 4-methoxybenzylidene-n-alkyl Schiff base |
| SA18 | 2-methoxybenzylidene-aniline Schiff base |
| SA19 | 2-methoxybenzylidene-isopropylamine Schiff base |
| SA20 | 2-methoxybenzylidene-4-methoxyaniline Schiff base |
| SA21 | 2-methyl-N,N-diethylaniline |
| SA22 | bis(2-methoxybenzylidene)ethylenediamine Schiff base |

Comparative Example C1

To determine the gel time for an unstabilized epoxy composition, 0.01g of $Cp_2FeSbF_6$ was weighed into an aluminum dish and 0.025g of gamma-butyrolactone added to completely dissolve the catalyst. To this was added 2.00g of ERL-4221, mixed thoroughly and then placed on a hot plate at 50° C. and the time to produce a gel was recorded. The presence of gel was indicated by the formation of insoluble material, or an increase in viscosity. In this example gel was formed after 90 sec at 50° C.

Examples 1–6

Stock solutions of Schiff base stabilizing additive and epoxy were prepared by first mixing 0.1 g of the Schiff base with 10 g of ERL-4221. The mixtures were heated to 50° C. and stirred to complete dissolution of the additive in the epoxy. This produced a 1% w/w solution of additive in the epoxy. Lower concentrations of additive were obtained by successive dilution. Gel times were determined following the procedure described in Comparative Example C1.

The standard procedure was to weigh out 0.01 g of $Cp_2FeSbF_6$ into an aluminum pan, add 0.025 g gamma-butyrolactone then 2.0 g of the additive/epoxy solution. After thorough mixing, the composition was placed on a series of hot plates set at successively higher temperatures. If a composition did not form a gel at a lower temperature it was then moved to a higher temperature until a gel was formed. The time to form a gel was recorded.

The data of Examples 1–6 (see Table 1, below) show that the Schiff base stabilizing additives can be used to control the temperature of polymerization of an initiation system/epoxy composition. These additives can be used to increase the gel temperature of a composition when compared to Comparative Example C1. This stabilizing effect can be controlled by the identity and concentration of the additive. The ability to move the temperature of polymerization is the ability to control the shelf life of a composition at lower temperatures but still obtain rapid cure at a higher temperature.

TABLE 1

Gel Time Experiments

| Exs. | Additive | 50° C. | 100° C. | 150° C. |
|---|---|---|---|---|
| 1 | 1.0% SA1 | 600 ng | 40 g | — |
| 2 | 1.0% SA2 | 600 ng | 720 ng | 45 g |
| 3 | 0.25% SA3 | 600 ng | 600 ng | 30 g |
| 4 | 0.125% SA3 | 600 ng | 30 g | — |
| 5 | 0.25% SA4 | 600 ng | 180 g | — |
| 6 | 0.125% SA4 | 600 ng | 30 g | — |

Gel times are in seconds
ng means no gel formed after the specified time
g means gel formed after the specified time
— means no test was carried out for that combination

Comparative Example C2

To determine the gel time for an unstabilized epoxy composition, 0.01 g of $Cp_2FeSbF_6$, was weighed into an aluminum dish and 0.025 g of gamma-butyrolactone added, then 2.00 g of Epon 828 was added, mixed thoroughly and then placed on a hot plate at 100° C. and the time to produce a gel was recorded. The presence of gel was indicated by the presence of insoluble material. Gel was formed after 15 minutes at 100° C.

Examples 7–15

Stock solutions of Schiff base stabilizing additive and epoxy were prepared by first mixing 0.1 g of the Schiff base with 10 g of Epon 828. The mixtures were heated to 100° C. and stirred to complete dissolution of the additive in the epoxy. The solutions were then cooled to room temperature. This produced a 1% w/w solution of additive in the epoxy. Lower concentrations of additive were obtained by successive dilution. Gel times were determined following the procedure described in Examples 1–6 and are shown in Table 2.

The data of Examples 7–15 show that the Schiff base stabilizing additives can be used to control the temperature of polymerization of an initiation system/epoxy composition. These additives can be used to increase the gel temperature of a composition when compared to Comparative Example C2. This stabilizing effect can be controlled by the identity and concentration of the additive. The ability to move the temperature of polymerization is the ability to control the shelf life of a composition at lower temperatures. Relative to Comparative Example C2, Examples 7–15 show that a range of stability can be obtained when the stabilizing additives are used with the cationic organometallic compounds of the subject invention.

TABLE 2

Gel Time Experiments

| Exs. | Additive | 100° C. | 150° C. |
|---|---|---|---|
| 7 | 0.5% SA1 | 45 ng | 2 g |
| 8 | 0.125% SA2 | 45 ng | 11 g |
| 9 | 0.5% SA5 | 45 ng | 5 g |
| 10 | 0.125% SA3 | 45 ng | 3 g |
| 11 | 0.25% SA4 | 45 ng | 4 g |
| 12 | 0.25% SA6 | 45 ng | 20 g |
| 13 | 0.5% SA7 | 45 ng | 1 g |
| 14 | 0.125% SA8 | 45 ng | 15 g |
| 15 | 0.25% SA9 | 45 ng | 15 g |

Gel times are in minutes.
ng means no gel formed after the specified time.
g means gel formed after the specified time.

Comparative Examples C3–C6

To test the effect of catalyst concentration on gel time, a series of catalyst/epoxy compositions were prepared and evaluated following the procedure and using the same materials described in Comparative Example C2. The results of these evaluations are shown in Table 3.

TABLE 3

Effect of Catalyst Concentration on Gel Time

| Comparative Example | Catalyst Concentration | 100° C. |
|---|---|---|
| C3 | 2.0% | 8 g |
| C4 | 1.0% | 13 g |
| C5 | 0.5% | 16 g |
| C6 | 0.25% | 25 g |

Gel times are in minutes
g means gel formed after the specified time

Examples 16–19

To test the effect of catalyst concentration on gel time, a series of catalyst/additive/epoxy compositions were prepared and evaluated following the procedure and using the same epoxy and catalyst described in Examples 7–15. The additive, SA5, was kept at a constant level of 0.5% w/w. The results of these evaluations are shown in Table 4.

These trials show that a combination of catalyst concentration and additive can be used to control the gel time and temperature for a catalyst/additive/epoxy composition. The increase in time and temperature to produce a gel for Examples 16–19 over comparative Examples C3–C6 show the utility of the stabilizing additives of the disclosure in controlling cure of epoxy compositions.

TABLE 4

Effect of Catalyst Concentration on Gel Time

| Examples | Catalyst Concentration | 100° C. | 150° C. |
|---|---|---|---|
| 16 | 2% | 20 g | — |
| 17 | 1% | 45 ng | 1 g |
| 18 | 0.5% | 45 ng | 4 g |
| 19 | 0.25% | 45 ng | 7 g |

Gel times are in minutes
ng means no gel formed after the specified time
g means gel formed after the specified time
— means test not performed.

Comparative Examples C7–C10

To test the effect of catalyst concentration on gel time, a series of catalyst/epoxy/polyol compositions were prepared and evaluated following the procedure described in Comparative Example C2. The ratio of epoxy functionality to hydroxyl functionality was selected as 1/0.4. The amount of materials to mix to obtain this ratio was determined by using an epoxy equivalent weight of 188 for the epoxy, Epon 828, and a hydroxyl equivalent weight of 45.06 for the polyol, 1,4-butanediol. The results of these evaluations are shown in Table 5.

Compared to the results in Comparative Examples C3–C6, the gel times with a polyol present are in general shorter than without the polyol. This makes these compositions more difficult to stabilize.

TABLE 5

Effect of Catalyst Concentration on Gel Time

| Comparative Example | Catalyst Concentration | 100° C. | 150° C. |
|---|---|---|---|
| C7 | 2.0% | 1.5 g | — |
| C8 | 1.0% | 5 g | — |
| C9 | 0.5% | 7 g | — |
| C10 | 0.25% | 20 g | — |

Gel times are in minutes
g means gel formed after the specified time

Examples 20–23

To evaluate the effect of catalyst concentration on gel time, a series of catalyst/additive/epoxy/polyol compositions were prepared using the same catalyst/epoxy/polyol materials and evaluated following the procedure described in Comparative Examples C7–C10. The additive, SA11, was kept at a constant level of 0.5% w/w. The results of these evaluations are shown in Table 6.

These trials show that a combination of catalyst concentration and additive can be used to control the gel time and temperature for a catalyst/additive/epoxy/polyol composition. The increase in time and temperature to produce a gel for Examples 20–23 over Comparative Examples C7–C10 show the utility of the stabilizing additives of the disclosure in controlling cure of epoxy/polyol compositions. While inhibiting gel formation of the compositions at lower temperatures, the stabilizing additives still allowed rapid cure at a slightly higher temperature.

TABLE 6

Effect of Catalyst Concentration on Gel Times

| Example | Catalyst Concentration | 100° C. | 150° C. |
|---|---|---|---|
| 20 | 2% | 40 g | — |
| 21 | 1% | 45 ng | 1.5 g |
| 22 | 0.5% | 45 ng | 2 g |
| 23 | 0.25% | 45 ng | 4 g |

Gel times are in minutes
ng means no gel formed after the specified time
g means gel formed after the specified time
— means test not performed.

Examples 24–26 and Comparative Example C11

To evaluate the effect of the polyol and epoxy/hydroxyl ratio on the gel time and temperature of a catalyst/epoxy/polyol composition, a series of evaluations were performed varying the polyol and its amount. Stock solution was prepared by mixing 100 g Epon 828 and 25.14 g of 1,2-hexanediol to produce a composition of 1/0.8 epoxy/hydroxyl ratio. A 1% solution of stabilizing additive SA16 was prepared by mixing 0.1 g of SA16 and 10 g of the stock solution. Lower concentrations of SA16 were obtained by successive dilution.

Trial samples were prepared by mixing adding 0.025 g propylene carbonate to 0.01 g $Cp_2FeSbF_6$ in an aluminum dish, dissolving the catalyst, then adding either the stock solution or a solution containing additive SA16. Gel times were obtained by the method described in Comparative Example C1.

The data in Table 7 demonstrate the stabilizing effect of the additives by increasing the cure temperature to a higher but still accessible temperature or a longer but still reasonable time. The gel time and temperature can be adjusted by the level of the stabilizing additive.

TABLE 7

Effect of Concentration of Stabilizing Additive on Gel Times

| Exs. | Additive | 100° C. | 150° C. | 180° C. |
|---|---|---|---|---|
| C11 | None | 45 ng | 2 g | — |
| 24 | 0.5% SA16 | 45 ng | 30 ng | 5 g |
| 25 | 0.25% SA16 | 45 ng | 6 g | — |
| 26 | 0.125% SA16 | 45 ng | 3 g | — |

Gel times are in minutes
ng means no gel formed after the specified time
g means gel formed after the specified time
— means no test was carried out for that combination.

Examples 27–30 and Comparative Examples C12–14

A series of curable compositions using different catalysts were prepared to evaluate the effect of the stabilizing additives in an epoxy/polyol composition. The epoxy/polyol composition was the same as used in Comparative Examples C7–C10 and the stabilized compositions used SA3 as the stabilizing additive in the amount listed in Table 8. The curable compositions were prepared by placing 0.01 g of the selected catalyst in a dish, adding 0.025 g of propylene carbonate to dissolve the catalyst then adding 2.0 g of the epoxy/polyol composition with or without stabilizing additive. Gel times were determined as described in Comparative Example C1.

The data in Table 8 show that the stabilizing additive/catalyst combination can be varied to obtain a wide range of gel times and temperatures. The data also show that one additive can be effective with a wide range of catalysts.

TABLE 8

Effect of Catalyst on Gel Times

| Exs. | Catalyst | Additive | 100° C. | 150° C. | 180° C. |
|---|---|---|---|---|---|
| Comp. Ex. C12 | #2 | No additive | 13 g | — | — |
| 27 | #2 | 0.125% SA3 | 45 ng | 9 g | — |
| Comp. Ex. C13 | #3 | No additive | 45 ng | 2 g | — |
| 28 | #3 | 0.125% SA3 | 45 ng | 18 g | — |
| Comp. Ex. C14 | #4 | No additive | 18 g | — | — |
| 29 | #4 | 0.125% SA3 | 45 ng | 30 ng | 30 ng |
| 30 | #4 | 0.0625% SA3 | 45 ng | 7 g | — |

Gel times are in minutes
ng means no gel formed after the specified time
g means gel formed after the specified time
— means no test was carried out for that combination.
Catalysts #2 $Cp_2FeSbF_6$, #3 $(MeCP)_2FeSbF_6$, #4 $(Ph_3SnCp)_2FeSbF_6$.

Examples 31–33 and Comparative Example C15

A curable composition's viscosity can be used to measure its useful work life. Maintaining a stable viscosity over a set time period, typically hours or days, while still having a reasonable curing time, can make a composition more useful. Cure times at easily accessible temperatures has been demonstrated in previous examples. This example uses viscosity to demonstrate the increased useful work time for a curable composition when the catalyst/additive combinations of the present invention are utilized.

Viscosity measurements were made using a Brookfield Model DV-1 viscosimeter at room temperature, 22°–23° C. Samples were placed in 100 ml plastic beakers for measurements. Viscosity measurements were recorded over a specified time period.

These examples use viscosity measurements to demonstrate the increased useful work time for a curable epoxy composition when the catalyst/additive combinations of the present invention are utilized.

For Example 31, a 0.125% additive in epoxy mixture was prepared by adding together 0.24 g of additive SA17 and 200 g of Epon 828. For Example 32, a 0.5% additive in epoxy mixture was prepared by adding together 1.0 g of additive SA1 and 200 g of Epon 828. For Example 33, a 0,125% additive in epoxy mixture was prepared by adding together 0.240 g of additive SA12 and 200 g of Epon 828. These compositions were heated, mixed thoroughly and allowed to cool to room temperature before use.

A curable composition was prepared from 0.75 g of $Cp_2FeSbF_6$, 1.0 g gamma-butyrolactone and 150 g of the each of the preceding additive/epoxy mixtures.

For Comparative Example C15, a curable composition was prepared from 0.75 g of $Cp_2FeSbF_6$, 1.0 g gamma-butyrolactone and 150 g of Epon 828.

The data in Table 9 show that without the stabilizing additive, the curable composition increased by about a factor of ten over the first eight hours and by a factor of about 300 to 400 over 24 hours. With the stabilizing additive, the viscosity underwent little change over the total time of the measurements.

TABLE 9

Viscosity Measurements over Time

| Time, in hours | Example 31* | Example 32* | Example 33* | Comparative Example C15* |
|---|---|---|---|---|
| 0 | 19000 | 15800 | 17000 | 17800 |
| 1 | 17000 | 16200 | 17200 | 18200 |
| 2 | 17000 | 16400 | 17200 | 21600 |
| 3 | 17000 | 16600 | 17400 | 28200 |
| 4 | 15800 | 15800 | 17400 | 49000 |
| 5 | 16000 | 15400 | 16600 | 77200 |
| 6 | 15600 | 15400 | 16200 | 119800 |
| 7 | 15400 | 15200 | 15600 | 180400 |
| 24 | 17000 | 17600 | 16600 | 4136000 |
| 48 | 18000 | 21200 | 18800 | cured hard |
| 126 | 17000 | 25400 | 19200 | cured hard |

*viscosity in centipoise

Examples 34–35 and Comparative Examples C16–17

These examples use viscosity measurements to demonstrate the increased useful work time for a curable epoxy/polyol composition when the catalyst/additive combinations of the present invention are utilized.

A mixture of 95.12 g of polyethylene glycol 400 and g of Epon 828 was prepared to give an epoxy/hydroxyl functionality ratio of 1/0.2. For Example 34, a 0.125% additive composition was prepared by adding together 0.25 g of additive SA17 and 200 g of polyethylene glycol Epon 828 mixture.

A mixture of 46.88 g of 2-butene-1,4-diol in 400 g Epon 828 was prepared to give an epoxy/hydroxyl ratio of 1/0.5. For Example 35, a 0.125% additive composition was prepared by adding together 0.25 g of additive SA18 and 200 g of the 2-butene-1,2-diol/Epon 828 mixture. These compositions were heated, mixed thoroughly and allowed to cool to room temperature before use.

A curable composition was prepared from 0.75 g of $Cp_2FeSbF_6$, 1.0 g gamma-butyrolactone and 150 g of the each of the preceding additive/epoxy/polyol mixtures.

For Comparative Example C16, a curable composition was prepared from 0.75 g of $Cp_2FeSbF_6$, 1.0 g gamma-butyrolactone and 150 g of the polyethylene glycol 400 Epon 828 mixture. For Comparative Example C17, a curable composition was prepared from 0.75 g of $Cp_2FeSbF_6$, 1.0 g gamma-butyrolactone and 150 g of the 2-butene-1,2-diol/Epon 828 mixture.

Viscosity measurements were made as described in Examples 31–33. The data in Table 10 show that without the stabilizing additive, the viscosity of the curable composition increases over the time period of the measurements. With the stabilizing additive, the viscosity remained essentially unchanged over the total time of the measurements.

TABLE 10

Viscosity Measurements over Time

| Time, in hours | Example 34* | Comparative Example C16* | Example 35* | Comparative Example C17* |
|---|---|---|---|---|
| 0 | 2480 | 2520 | 6560 | 6240 |
| 1 | 2480 | 2600 | 6480 | 4960 |
| 2 | 2560 | 2960 | 7040 | 6240 |
| 3.5 | 2400 | 4080 | 6480 | 6400 |
| 4.5 | 2320 | 5520 | 6480 | 6160 |
| 5.5 | 2280 | 7240 | 6240 | 5360 |
| 6.5 | 2120 | 9160 | 6080 | 5440 |
| 7.5 | 2200 | 11760 | 5760 | 6240 |
| 8.5 | 2200 | 16280 | 6080 | 10960 |
| 72 | 2440 | cured | 7120 | cured |

*viscosity in centipoise

Examples 36–39 and Comparative Example C18

DSC tests were run on unstabilized and stabilized catalyst/epoxy/polyol compositions to test the effect of varying the stabilizing additive level. A stock solution was prepared from 40 g ERL-4221 and 10 g of 1,2-propanediol, heating mixing well and allowing to cool before proceeding. A stock solution of stabilizing additive/epoxy/polyol was prepared by mixing 0.32 g of additive SA21 and 10 g of ERL-4221/polyol to produce a 4% SA21/ERL-4221/polyol, w/w, mixture. Successive dilution was used to prepare mixtures of 2%, 1% and 0.5% SA21/ERL-4221/polyol, w/w. For each Example, a test solution was prepared by mixing 0.01 g of $(Me_3SiCp)2FeSbF_6$ and 2.5 g of the appropriate additive/epoxy/polyol stock solution.

For Comparative Example C18, a curable composition was prepared by mixing 0.01 g $(Me_3SiCp)_2FeSbF_6$ and 2.5 g of ERL-4221.

After each composition was thoroughly mixed, DSC samples were prepared in sealed liquid sample pans, sample size 8–13 mg. The area under the exotherm and the peak temperature were recorded for each run. The results of these tests are presented in Table 11.

The data in Table 11 show how dramatically catalyst/epoxy/alcohol compositions were stabilized when the appropriate stabilizing additive was used. Without the stabilizing additive, Comparative Example C18 lost 90% of its cure energy in 6 days while all the Examples retained 90–100% of their activity. The Examples also demonstrated that the stability can be adjusted by the concentration of the stabilizing additive.

TABLE 11

DSC Measurements
Energy (J/g)/Peak Temperature (°C.)

| Exs. | Day 1 | Day 6 | Day 15 | Day 22 |
|---|---|---|---|---|
| Comp. Ex. C18 | 426/87 | 45/98 | 27/97 | 17/100 |
| 36 | 487/168 | 482/165 | 481/164 | 473/164 |
| 37 | 507/161 | 484/160 | 500/157 | 464/158 |
| 38 | 496/147 | 503/154 | 457/153 | 419/153 |
| 39 | 491/138 | 469/139 | 448/139 | 201/142 |

Examples 40 and 41 and Comparative Example C19

Besides maintaining thermal stability it was important that physical properties of the cured composition were not affected adversely by the use of a stabilizing additive. The previous examples have shown that the stabilizing additives when combined with the catalyst/curable materials mixtures do produce compositions of controllable thermal stability. This set of Examples demonstrates that the physical properties of the final cured composition were not substantially altered by the use of the stabilizing additives.

For Comparative Example C19, 0.5 g of $Cp_2FeSbF_6$ was dissolved in 0.5 g of gamma-butyrolactone then 50 g of Epon 828 was added mixed thoroughly and heated briefly to 40° C. to eliminate bubbles from the sample. For Examples 40 and 41 were made by first preparing a 1% solution of SA1 and SA20, respectively, in Epon 828 by mixing together the components, heating them to 40° C., mixing thoroughly and allowing the mixture to cool before proceeding. Curable compositions were prepared by dissolving 0.5 g $Cp_2FeSbF_6$ in 0.5 g of gamma-butyrolactone then adding 50 g 1% stabilizing additive/Epon 828 mixture, mixing thoroughly and heating briefly to 40° C. to eliminate bubbles from the sample.

The tensile test samples were prepared as described in the testing section and the curing cycle was 15 minutes at 100° C., 15 minutes at 110° C., 15 minutes at 130° C. and 30 minutes at 140° C. Tensile tests were performed as described in the testing section. The results of the tensile tests are shown in Table 12. As can be seen from the data presented in Table 12, the presence of the stabilizing additive had little effect on the physical properties of the cured compositions. Other examples have shown the presence of these stabilizing additives increased the work time of compositions and these examples demonstrated that physical properties were not sacrificed.

TABLE 12

| Exs. | Tensile Strength in MPa | Elongation at Break in % | Energy in N-m | Modulus in MPa |
|---|---|---|---|---|
| Comp. Ex. C19 | 75.3 | 9.5 | 0.69 | 1149 |
| 40 | 73.1 | 8.5 | 0.67 | 1194 |
| 41 | 71.1 | 8.1 | 0.54 | 1175 |

Comparative Example C20

$(Mesitylene)_2Fe(SbF_6)_2$ (0.01 g) was added to an aluminum dish and 0.03 g of gamma-butyrolactone was added to completely dissolve the catalyst. One g of Epon 828 was added and mixed in thoroughly. Several DSC sample pans were prepared, hermetically sealed, and stored at room temperature. Shelf life analysis of the mixture was performed by DSC on the day of preparation (0 weeks), and over time. The data of Table 13 illustrate that the composition used had poor shelf-life with only 26% of the maximum cure energy retained. This means that 74% of the monomer has polymerized.

TABLE 13

Polymerization Exotherm Profile over Time

| Reaction Time (weeks) | Exotherm Energy (Joules/gram) | $T_{onset}$ (°C.) | $T_{max}$ (°C.) | $T_{end}$ (°C.) |
|---|---|---|---|---|
| 0 | 518 | 45 | 98 | 167 |

TABLE 13-continued

Polymerization Exotherm Profile over Time

| Reaction Time (weeks) | Exotherm Energy (Joules/gram) | $T_{onset}$ (°C.) | $T_{max}$ (°C.) | $T_{end}$ (°C.) |
|---|---|---|---|---|
| 1 | 278 | 55 | 103 | 120 |
| 2 | 184 | >50* | 106 | 122 |
| 3 | 167 | >50* | 109 | 129 |
| 4 | 175 | >50* | 111 | 124 |
| 6 | 137 | >60** | 111 | 123 |

$T_{onset}$ = point of initial exothermicity; $T_{max}$ = maximum exotherm temperature; $T_{end}$ = point at which 90% of the material has cured. *endothermic transition between 35–50° C. **endothermic transition between 40–60° C.

Example 42

$(Mesitylene)_2Fe(SbF_6)_2$ (0.01 g) was added to an aluminum dish and 0.04 g of 3-methylsulfolane was added to completely dissolve the catalyst. Epon 828 (1 g) was added and mixed in thoroughly. Several DSC sample pans were prepared and analyzed as in Example C20. As can be seen from the data of Table 14, when 3-methylsulfolane was used as a solvent, the formulation had greater work time, as evidenced by the higher onset temperatures; additionally, shelf like was improved as evidenced by a decrease in exotherm energy slower than that observed in Example C20.

TABLE 14

Polymerization Exotherm Profile over Time

| Reaction Time (weeks) | Exotherm Energy (Joules/gram) | $T_{onset}$ (°C.) | $T_{max}$ (°C.) | $T_{end}$ (°C.) |
|---|---|---|---|---|
| 0 | 503 | 75 | 118 | 175 |
| 1 | 425 | 75 | 109 | 153 |
| 2 | 318 | 65 | 111 | 155 |
| 3 | 271 | 70 | 114 | 126 |
| 4 | 242 | 70 | 116 | 122 |
| 6 | 206 | 75 | 118 | 122 |

Comparative Example C21

$(Mesitylene)_2Fe(SbF_6)_2$ (0.01 g) was added to an aluminum dish and 0.04 g of propylene carbonate was added to completely dissolve the catalyst. Epon 828 (1 g) was added and mixed in thoroughly. Analysis of the cure by DSC showed $T_{onset}$=75° C., $T_{max}$=117° C., and $T_{end}$=162° C. When compared to the data of Example C20, it can be seen that the use of propylene carbonate as solvent provided greater stability as evidenced by the higher onset temperature.

Example 43

$(Mesitylene)_2Fe(SbF_6)_2$ (0.01 g) was added to an aluminum dish and 0.04 g of 3-methylsulfolane was added to completely dissolve the catalyst. Epon 828 (2 g) was added and mixed in thoroughly. Several DSC sample pans were prepared and analyzed as in Example C20. As can be seen from the data of Table 15, after 6 weeks of the maximum cure energy was retained.

TABLE 15

Polymerization Exotherm Profile over Time

| Reaction Time (weeks) | Exotherm Energy (Joules/gram) | $T_{max}$ (°C.) |
|---|---|---|
| 0 | 480 | 113 |
| 1 | 524 | 111 |
| 2 | 479 | 108 |
| 3 | 437 | 110 |
| 4 | 395 | 115 |
| 5 | 361 | 114 |
| 6 | 258 | 116 |

Example 44

(Mesitylene)$_2$Fe(SbF$_6$)$_2$ (0.01 g) was added to an aluminum dish and 0.04 g of 3-methylsulfolane was added to completely dissolve the catalyst. One g of an Epon 1,6-hexanediol/CHDM (78:11:11 w/w) mixture was added and mixed in thoroughly. Several DSC sample pans were prepared and analyzed as in Example C20. As can be seen from the data of Table 16, this composition retained 19% of the maximum cure energy after five weeks.

TABLE 16

Polymerization Exotherm Profile over Time

| Reaction Time (weeks) | Exotherm Energy (Joules/gram) | $T_{max}$ (°C.) |
|---|---|---|
| 0 | 426 | 116 |
| 1 | 396 | 111 |
| 2 | 333 | 111 |
| 3 | 258 | 115 |
| 4 | 105 | 113 |
| 5 | 82 | 124 |

Comparative Example C22

Finely powdered (mesitylene)$_2$Fe(SbF$_6$)$_2$ (0.01 g) was dispersed in 1 g of an Epon 828/1,6-hexanediol/CHDM (78:11:11 w/w) mixture. Several DSC sample pans were prepared and analyzed as in Example C20, with the results listed in Table 17.

TABLE 17

Polymerization Exotherm Profile over Time

| Reaction Time (weeks) | Exotherm Energy (Joules/gram) | $T_{max}$ (°C.) |
|---|---|---|
| 0 | 429 | 118 |
| 1 | 425 | 114 |
| 2 | 421 | 113 |
| 3 | 394 | 114 |
| 4 | 210 | 110 |
| 5 | 165 | 110 |
| 6 | 154 | 108 |

Example 45

(Mesitylene)$_2$Fe(SbF$_6$)$_2$ (0.01 g) was added to an aluminum dish and 0.04 g of 3-methylsulfolane was added to completely dissolve the catalyst. Two g of an Epon 828/1, 6-hexanediol/CHDM (78:11:11 w/w) mixture was added and mixed in thoroughly. Several DSC sample pans were prepared and analyzed as in Example C20. As can be seen from the data of Table 18, at the end of a six-week period this composition retained 28% of the maximum cure energy.

TABLE 18

Polymerization Exotherm Profile over Time

| Reaction Time (weeks) | Exotherm Energy (Joules/gram) | $T_{max}$ (°C.) |
|---|---|---|
| 0 | 426 | 115 |
| 1 | 429 | 112 |
| 2 | 414 | 113 |
| 3 | 372 | 112 |
| 4 | 228 | 115 |
| 5 | 148 | 112 |
| 6 | 122 | 116 |

Example 46

(Mesitylene)$_2$Fe(SbF$_6$)$_2$ (0.01 g) was added to an aluminum dish and 0.04 g of 3-methylsulfolane was added to completely dissolve the catalyst. Two g of an Epon 828/15-crown-5 (100:0.29 w/w) mixture was added and mixed in thoroughly. Several DSC sample pans were prepared and analyzed as in Example C20. When compared to Table 15, the data of Table 19 illustrate that addition of 15-crown-5 to the composition resulted in nearly complete stabilization over six weeks, with 95% of the maximum cure energy being retained.

TABLE 19

Polymerization Exotherm Profile over Time

| Reaction Time (weeks) | Exotherm Energy (Joules/gram) | $T_{max}$ (°C.) |
|---|---|---|
| 0 | 467 | 152 |
| 1 | 471 | 148 |
| 2 | 497 | 147 |
| 3 | 500 | 135 |
| 4 | 489 | 138 |
| 5 | 475 | 133 |
| 6 | 476 | 138 |

Example 47

(Mesitylene)$_2$Fe(SbF$_6$)$_2$ (0.01 g) was added to an aluminum dish and 0.04 g of 3-methylsulfolane was added to completely dissolve the catalyst. Two g of an Epon 828/15-crown-5 (100:0.14 w/w) mixture was added and mixed in thoroughly. Several DSC sample pans were prepared and analyzed as in Example C20. The data of Table 20 illustrate the stabilizing effect the addition of 15-crown-5 had on the room temperature cure of the composition; 96% of the maximum cure energy was retained after a six-week period with the formulation of this example, whereas the data from Example 43 show that in an analogous formulation without added 15-crown-5, 49% of the maximum cure energy was retained.

TABLE 20

Polymerization Exotherm Profile over Time

| Reaction Time (weeks) | Exotherm Energy (Joules/Gram) | $T_{max}$ (°C.) |
|---|---|---|
| 0 | 462 | 147 |
| 1 | 429 | 143 |
| 2 | 453 | 132 |
| 3 | 485 | 124 |

TABLE 20-continued

Polymerization Exotherm Profile over Time

| Reaction Time (weeks) | Exotherm Energy (Joules/Gram) | $T_{max}$ (°C.) |
|---|---|---|
| 4 | 485 | 120 |
| 5 | 469 | 117 |
| 6 | 467 | 123 |

Example 48

Evaluations were carried out to examine the effect of 15-crown-5 on the shelf-life of epoxy-alcohol mixtures. A stock solution of epoxide/alcohol/additive was prepared by adding 0.29 g of 15-crown-5 to a 100 g mixture of Epon 828/1,6-hexanediol/CHDM (78:11:11 w/w).

(Mesitylene)$_2$Fe(SbF$_6$)$_2$ (0.01 g) was added to an aluminum dish. 3-methylsulfolane (0.04 g) was added to completely dissolve the catalyst, after which 2 g of the stock solution was added and mixed thoroughly. Several DSC sample pans were prepared and analyzed as in Example C20. When compared to Table 18, the data of Table 21 illustrate the stabilizing effect the addition of 15-crown-5 had on the room temperature cure of the composition.

TABLE 21

Polymerization Exotherm Profile over Time

| Reaction Time (weeks) | Exotherm Energy (Joules/gram) | $T_{max}$ (°C.) |
|---|---|---|
| 0 | 367 | 146 |
| 1 | 406 | 130 |
| 2 | 316 | 123 |
| 3 | 361 | 125 |
| 4 | 412 | 127 |
| 5 | 261 | 121 |
| 6 | 157 | 116 |

Example 49

Finely powdered (mesitylene)$_2$Fe(SbF$_6$)$_2$ (0.01 g) was dispersed in 2 g of the stock solution prepared in Example 48, and mixed thoroughly. Several DSC sample pans were prepared and analyzed as in Example C20, with the results listed in Table 22. The data of Table 22 illustrate the stabilizing effect the addition of 15-crown- 5 had on the room temperature cure of the composition; 87% of the maximum cure energy was retained after a six-week period.

TABLE 22

Polymerization Exotherm Profile over Time

| Reaction Time (weeks) | Exotherm Energy (Joules/gram) | $T_{max}$ (°C.) |
|---|---|---|
| 0 | 455 | 154 |
| 1 | 441 | 145 |
| 2 | 421 | 143 |
| 3 | 429 | 140 |
| 4 | 402 | 131 |
| 5 | 411 | 135 |
| 6 | 398 | 135 |

Example 50

Further evaluations to examine the effect of 15-crown- 5 on the shelf-life of epoxy-alcohol mixtures. A stock solution of epoxide/alcohol/additive was prepared by adding 0.14 g of 15-crown-5 to a 100 g mixture of Epon 828/1,6-hexanediol/CHDM (78:11:11 w/w).

(Mesitylene)$_2$Fe(SbF$_6$)$_2$ (0.01 g) was added to an aluminum dish. 3-methylsulfolane (0.04 g) was added to completely dissolve the catalyst, after which 2 g of the stock solution was added and mixed thoroughly. Several DSC sample pans were prepared and analyzed as in Example C20. When compared to Table 18 (Example 45), the data in Table 23 illustrate the stabilizing effect the addition of 15-crown-5 had on the room temperature cure of the composition; with the formulation of this example, 46% of the maximum cure energy was retained after a six-week period, while only was retained in the analogous formulation without the 15-crown-5.

TABLE 23

Polymerization Exotherm Profile over Time

| Reaction Time (weeks) | Exotherm Energy (Joules/gram) | $T_{max}$ (°C.) |
|---|---|---|
| 0 | 429 | 126 |
| 1 | 409 | 122 |
| 2 | 419 | 121 |
| 3 | 394 | 119 |
| 4 | 387 | 116 |
| 5 | 344 | 116 |
| 6 | 282 | 114 |

Example 51

Finely powdered (mesitylene)$_2$Fe(SbF$_6$)$_2$ (0.01 g), was dispersed in 2 g of the stock solution prepared in Example 50, and mixed thoroughly. Several DSC sample pans were prepared and analyzed as in Example C20. When compared to data of Table 17, the data of Table 24 illustrate the stabilizing effect the addition of 15-crown- 5 had on the room temperature cure of the composition.

TABLE 24

Polymerization Exotherm Profile over Time

| Reaction Time (weeks) | Exotherm Energy (Joules/gram) | $T_{max}$ (°C.) |
|---|---|---|
| 0 | 407 | 139 |
| 1 | 431 | 137 |
| 2 | 418 | 136 |
| 3 | 406 | 135 |
| 4 | 431 | 129 |
| 5 | 426 | 131 |
| 6 | 398 | 122 |

Examples 52A and 52B

Trials were run to examine the affect of a second additive to a stabilized composition of the invention.

52A: Trials were run to examine the effect of 2- 2'-bipyridyl on the shelf-life of epoxy resins. A stock solution of epoxide/additive was prepared by adding 0.10 g of finely dispersed bipyridyl to 100 g of Epon 828. This mixture was heated to 80° C. for approximately 20 minutes with vigorous shaking to ensure complete dissolution of the additive in the epoxide.

(Mesitylene)$_2$Fe(SbF$_6$)$_2$ (0.01 g) was added to an aluminum dish and 0.04 g of 3-methylsulfolane was added to completely dissolve the catalyst. Two g of the stock solution was added and mixed in thoroughly. Several DSC sample pans were prepared and analyzed as in Example C20. The data in Table 25 illustrate that after a six-week period at room temperature, 59% of the maximum exotherm energy was retained, and little change was observed upon longer aging.

TABLE 25

Polymerization Exotherm Profile over Time

| Reaction Time (weeks) | Exotherm Energy (Joules/gram) | $T_{max}$ (°C.) |
|---|---|---|
| 0 | 452 | 116 |
| 1 | 495 | 116 |
| 2 | 468 | 115 |
| 3 | 493 | 112 |
| 5 | 424 | 115 |
| 6 | 290 | 113 |
| 13 | 312 | 122 |

52B: Trials were run to examine the effect of 1,10-phenanthroline on the shelf-life of epoxy resins. A stock solution of epoxide/additive was prepared by adding 0.12 g of finely dispersed 1,10-phenanthroline to 100 g of Epon 828. This mixture was heated to 80° C. for approximately 20 minutes with vigorous shaking to ensure complete dissolution of the additive in the epoxide.

(Mesitylene)$_2$Fe(SbF$_6$)$_2$ (0.01 g) was added to an aluminum dish and 0.04 g of 3-methylsulfolane was added to completely dissolve the catalyst. Two g of the stock solution was added and mixed in thoroughly. Several DSC sample pans were prepared and analyzed as in Example C20. When compared to the data in Table 15, the data of Table 26 illustrate the stabilizing effect the addition of 1,10-phenanthroline had on the room temperature cure of the composition. The data in Table 26 show that for this formulation 95% of the maximum cure energy was retained after a six-week period at room temperature; whereas, with only a class 1 stabilizing additive present (Example 43), 49% of the cure was retained. Additionally, when compared to the data in Table 25 it can be seen that the formulation containing 1,10-phenanthroline had a longer shelf life than did the formulation containing 2,2'-bipyridyl as was shown in Example 52A.

TABLE 26

Polymerization Exotherm Profile over Time

| Reaction Time (weeks) | Exotherm Energy (Joules/gram) | $T_{max}$ (°C.) |
|---|---|---|
| 0 | 501 | 116 |
| 1 | 495 | 118 |
| 2 | 454 | 118 |
| 3 | 506 | 116 |
| 4 | 486 | 116 |
| 5 | 504 | 115 |
| 6 | 481 | 115 |

Example 53

Evaluations were carried out to determine if lower levels of 1,10-phenanthroline would provide the same stabilization of the epoxy/catalyst mixture. A stock solution of epoxide/additive was prepared as in Example 52, using 0.06 g of finely dispersed 1,10-phenanthroline.

(Mesitylene)$_2$Fe(SbF$_6$)$_2$ (0.01 g) was added to an aluminum dish and 0.04 g of 3-methylsulfolane was added to completely dissolve the catalyst. Two g of the stock solution was added and mixed in thoroughly. Several DSC sample pans were prepared and analyzed as in Example C20. The data in Table 27 illustrate that the lower level of 1,10-phenanthroline was effective at stabilizing the cure, as 85% of the maximum exotherm energy was retained after a six-week period at room temperature, whereas, 49% of the cure was retained when only a class 1 stabilizing additive was present as was shown in Example 43.

TABLE 27

Polymerization Exotherm Profile over Time

| Reaction Time (weeks) | Exotherm Energy (Joules/gram) | $T_{max}$ (°C.) |
|---|---|---|
| 0 | 500 | 115 |
| 1 | 499 | 115 |
| 2 | 499 | 115 |
| 3 | 512 | 113 |
| 4 | 488 | 115 |
| 5 | 487 | 113 |
| 6 | 427 | 114 |

Example 54

Trials were run to examine the effect of 1,10-phenanthroline on the shelf-life of epoxy-alcohol resins. A stock solution of epoxide, alcohol, and additive was prepared by adding 0.06 g of finely dispersed 1,10-phenanthroline to a 100 g mixture of Epon 828/1,6-hexanediol/CHDM (78:11:11 w/w). This mixture was heated to 80° C. for approximately 20 minutes with vigorous shaking to ensure complete dissolution of the additive in the epoxide.

(Mesitylene)$_2$Fe(SbF$_6$)$_2$ (0.01 g) was added to an aluminum dish and 0.04 g of 3-methylsulfolane was added to completely dissolve the catalyst. Two g of the stock solution was added and mixed in thoroughly. Several DSC sample pans were prepared and analyzed as in Example C20. When compared to data of Table 18, the data of Table 28 illustrate the stabilizing effect the addition of 1,10-phenanthroline had on the room temperature cure of the composition.

TABLE 28

Polymerization Exotherm Profile over Time

| Reaction Time (weeks) | Exotherm Energy (Joules/gram) | $T_{max}$ (°C.) |
|---|---|---|
| 0 | 438 | 117 |
| 1 | 436 | 114 |
| 2 | 436 | 116 |
| 3 | 430 | 116 |
| 4 | 435 | 115 |
| 5 | 429 | 114 |
| 6 | 322 | 117 |

Example 55

Evaluations were performed to examine the effect of 2,4,6-tripyridyltriazine (TPTZ) on the shelf-life of epoxy resins. A stock solution of epoxide/additive was prepared by adding 0.10 g of finely dispersed TPTZ to g of Epon 828. This mixture was heated to 80° C. for approximately 20 minutes with vigorous shaking to ensure complete dissolution of the additive in the epoxide.

(Mesitylene)$_2$Fe(SbF$_6$)$_2$ (0.01 g) was added to an aluminum dish and 0.04 g of 3-methylsulfolane was added to completely dissolve the catalyst. Two g of the stock solution was added and mixed in thoroughly. Several DSC sample pans were prepared and analyzed as in Example C20. When compared to data of Table 15, the data of Table 29 illustrate the stabilizing effect the addition of TPTZ had on the room temperature cure of the composition.

TABLE 29

Polymerization Exotherm Profile over Time

| Reaction Time (weeks) | Exotherm Energy (Joules/gram) | $T_{max}$ (°C.) |
|---|---|---|
| 0 | 482 | 112 |
| 1 | 512 | 115 |
| 2 | 499 | 114 |
| 3 | 433 | 115 |
| 5 | 409 | 115 |
| 6 | 405 | 116 |
| 12 | 279 | 125 |

Example 56

Evaluations were performed to examine the effect of triphenylphosphine on the shelf-life of epoxy resins. A stock solution of epoxide/additive was prepared by adding 0.34 g of finely dispersed triphenylphosphine (SA14) to 100 g of Epon 828. This mixture was heated to 80° C. for approximately 20 minutes with vigorous shaking to ensure complete dissolution of the additive in the epoxide.

(Mesitylene)$_2$Fe(SbF$_6$)$_2$ (0.01 g) was added to an aluminum dish and 0.04 g of 3-methylsulfolane was added to completely dissolve the catalyst. Two g of the stock solution was added and mixed in thoroughly. Several DSC sample pans were prepared and analyzed as in Example C20. When compared to the data of Table 15, the data of Table 30 illustrate the stabilizing effect the addition of triphenylphosphine had on the room temperature cure of the composition.

TABLE 30

Polymerization Exotherm Profile over Time

| Reaction Time (weeks) | Exotherm Energy (Joules/gram) | $T_{max}$ (°C.) |
|---|---|---|
| 0 | 396 | 127 |
| 1 | 477 | 121 |
| 2 | 445 | 116 |
| 3 | 474 | 120 |
| 4 | 489 | 118 |
| 6 | 469 | 113 |
| 7 | 488 | 119 |
| 9 | 408 | 124 |

Preparation of Adhesive Premix

The epoxy based composition was prepared by combining 59.40 parts Epon 828, 5.87 parts WC68™, 8.88 parts Paraloid BTA IIIN2 copolymer. The mixture was stirred with a high shear mixer at about 115° C. for two hours, then cooled to room temperature. To this cooled mixture was added 20.59 parts GP-7I, 1.38 parts B37/2000, 2.58 parts TS-720, and 1.30 parts 0,254 mm (0.01 inch) glass beads (Cataphote, Inc., Jackson, Miss.) to make 100 parts of composition. High shear mixing was continued for 30 minutes at room temperature (23° C.), followed by vacuum degassing at room temperature. This mixture constituted the adhesive premix used in Examples C24–C25 and Examples 57–60.

Comparative Example C23 and Examples 57–61

Evaluations were performed to determine the initial overlap shear strength of an adhesive formulation, and to monitor the strength over time. Table 31 shows the composition formulations. The adhesive compositions were prepared by dissolution of the cationic organometallic salt and any additional additives in a solvent, followed by addition of the premix and difunctional alcohols. The mixture was stirred until a uniform mixture was obtained. The overlap shear data are shown below in Table 32.

TABLE 31

| Constituent | Adhesive Formulation Parts by Weight | | | | | |
|---|---|---|---|---|---|---|
| | Ex. 57 | Ex. C23 | Ex. 58 | Ex. 59 | Ex. 60 | Ex. 61 |
| Adhesive premix | 50.8 | 50.8 | 50.8 | 50.8 | 50.8 | 50.8 |
| 1,6-hexanediol | 3.6 | 3.6 | 3.6 | 3.6 | 3.0 | 3.0 |
| CHDM | 3.6 | 3.6 | 3.6 | 3.6 | 3.6 | 3.6 |
| (Mes)$_2$Fe-(SbF$_6$)$_2$ | 0.3 | — | 0.3 | 0.3 | — | — |
| Cp$_2$Fe-(SbF$_6$) | — | 0.3 | — | — | 0.3 | 0.3 |
| 1,10-phenan-thro-line | — | — | 0.07 | — | — | — |
| 15-crown-5 | — | — | — | 0.17 | — | — |
| SA1 | — | — | — | — | 0.3 | — |
| SA3 | — | — | — | — | — | 0.08 |
| 3-methyl-sulfolane | 0.5 | — | 0.5 | 0.5 | — | — |
| propylene carbonate | — | 0.5 | — | — | 0.5 | 0.5 |

TABLE 32

| | Overlap Shear Strength (MPa) over Time | | | | |
|---|---|---|---|---|---|
| Ex. | Initial | 1 Week | 3 Weeks | 4 Weeks | 6 Weeks |
| 57 | 10.33 | 10.55 | ** | * | * |
| 58 | 11.75 | 14.87 | 11.62 | *** | 14.24 |
| 59 | 16.10 | 16.67 | 13.83 | 16.58 | 15.36 |
| C23 | 13.51 | * | * | * | * |
| 60 | 16.21 | 15.05 | * | * | * |
| 61 | 13.90 | 13.00 | ** | * | * |

* = Sample hardened;
** = Sample too viscous to make good bonds;
*** = Sample not hard; however, no data taken.

Comparative Example C24 and Example 62

Studies were conducted to test the stabilizing effect of 15-crown-5 on formulations containing Cp$_2$Fe(SbF$_6$). Table 33 shows the composition formulation of Examples C24 and 62. Initial DSC analysis of Examples C24 and 62 gave exotherm energies of 297 J/g and 290 J/g, respectively. After one week Example 62 had become more viscous due to partial curing; DSC analysis gave an exotherm energy of 187 J/g. The formulation from Comparative Example C24 was hard, thus affirming the stabilizing effect of 15-crown-5 on formulations containing Cp$_2$Fe(SbF$_6$).

TABLE 33

| | Adhesive Formulation | |
|---|---|---|
| Constituent | Comparative Example 24 | Example 62 |
| Adhesive Premix | 50.8 | 50.8 |
| 1,6-hexanediol | 3.6 | 3.6 |
| CHDM | 3.6 | 3.6 |

TABLE 33-continued

| | Adhesive Formulation | |
|---|---|---|
| Constituent | Comparative Example 24 | Example 62 |
| $Cp_2Fe(SbF_6)$ | 0.3 | 0.3 |
| 15-Crown-5 | — | 0.2 |

Comparative Examples C25–C32

Evaluations were carried out to show how the organometallic salts disclosed within this invention performed differently from conventional Lewis acid catalysts. U.S. Pat. No. 4,503,211 teaches that $SbF_5$·diethylene glycol (DEG) is effective as a catalyst for epoxy polymerizations when added at approximately 3% by weight. Therefore, $SbF_5$·DEG was added in this amount to epoxy resins, and to epoxy/additive mixtures to determine the cure times as was performed in previous examples.

Comparative Example C25

In an aluminum dish, 0.06 g of $SbF_5$·DEG was added to 2.01 g of Epon 828 and mixed in thoroughly. As in Example C2 and Examples 7–15, planned gel time trials at 100° C. gave surprising results in that this formulation gel particles formed immediately, and a rapid exotherm occurred within 1.5 minutes of mixing at room temperature. As was seen in Example C2, the analogous formulation containing $Cp_2Fe(SbF_6)$ took 15 minutes to cure at 100° C. Additionally, the data of Table 15 show that an analogous formulation containing $(mesitylene)_2Fe(SbF_6)_2$ was stable at room temperature for at least two weeks before slow cure started.

Comparative Example C26

In an aluminum dish, 0.06 g of $SbF_5$·DEG was added to 2.01 g of an Epon 828/1,6-hexanediol/CHDM (78:11:11 w/w) mixture and mixed in thoroughly. Gel particles formed upon mixing and a rapid exotherm occurred within 2.5 minutes of mixing at room temperature. The data of Table 18 show that an analogous formulation containing $(mesitylene)_2Fe(SbF_6)_2$ was stable at room temperature for at least two weeks before slow cure started.

Comparative Example C27

A stock solution of Schiff base additive and epoxy was prepared by mixing 0.05 g of Schiff base additive SA1 with 20 g of Epon 828. The mixture was heated to 60° C. for 5 min and stirred to ensure uniform mixing of the additive in the epoxy. The mixture was cooled to room temperature before use.

In an aluminum dish, 0.06 g of $SbF_5$·DEG was added to 2.01 g of the Epon 828/additive mixture and mixed in thoroughly. Gel particles formed upon mixing, along with an increase in viscosity. After 12 hours the mixture was very viscous, but not completely cured.

Comparative Example C28

A stock solution of Schiff base additive and epoxy was prepared by mixing 0.10 g of Schiff base additive SA1 with 20 g of Epon 828. The mixture was heated to 60° C. for 5 min and stirred to ensure uniform mixing of the additive in the epoxy. The mixture was cooled to room temperature before use.

2.01 g of the Epon 828/additive mixture was weighed out in an aluminum dish and 0.06 g of $SbF_5$·DEG was added, mixed thoroughly. Gel particles formed upon mixing; when placed on a hot plate at 100° C., the gel particles darkened immediately and the bulk of the material cured to a granular solid within 1 minute. It is to be noted that in Example 7 an analogous composition containing $Cp_2FeSbF_6$ did not cure after 45 minutes at 100° C.

Comparative Example C29

A stock solution of Schiff base additive and epoxy was prepared by mixing 0.025 g of Schiff base additive SA3 with 20 g of Epon 828. The mixture was heated to 60° C. for 5 min and stirred to ensure uniform mixing of the additive in the epoxy. The mixture was cooled to room temperature before use.

In an aluminum dish, 0.06 g of $SbF_5$·DEG was added to 2.01 g of Epon 828 and mixed in thoroughly. Gel particles formed upon mixing and a hard granular product was produce within 2 minutes of mixing at room temperature. As was seen in Example 10, the analogous resin mixture containing $Cp_2Fe(SbF_6)$ did not gel even after 45 minutes at 100° C.

Comparative Example C30

In an aluminum dish, 0.06 g of $SbF_5$·DEG was added to 2.01 g of an Epon 828/15-crown-5 (100:0.29 w/w) mixture and mixed in thoroughly. Gel particles formed upon mixing and a rapid exotherm occurred within 2.5 minutes of mixing at room temperature. As can be seen from Example 46, an analogous resin mixture containing $(mesitylene)_2Fe(SbF_6)_2$ was stable at room temperature for at least six weeks.

Comparative Example C31

A stock solution of 15-crown-5 and epoxy was prepared by mixing 0.29 g of 15-crown-5 with 100 g of an Epon 828/1,6-hexanediol/CHDM (78:11:11 w/w) mixture and mixed in thoroughly.

In an aluminum dish, 0.06 g of $SbF_5$·DEG was added to 2.01 g of the stock solution and mixed in thoroughly. Gel particles formed upon mixing and a rapid exotherm occurred within 2 minutes of mixing at room temperature. The data of Example 48 show that an analogous resin mixture containing $(mesitylene)_2Fe(SbF_6)_2$ was stable at room temperature for at least two weeks before slow cure started.

Comparative Example C32

A stock solution of 1,10-phenanthroline and epoxy was prepared by mixing 0.12 g of 1,10-phenanthroline with 100 g of an Epon 828/1,6-hexanediol/CHDM (78:11:11 w/w) mixture and mixed in thoroughly.

In an aluminum dish, 0.06 g of $SbF_5$·DEG was added to 2.01 g of the stock solution and mixed in thoroughly at room temperature. Gel particles formed upon mixing and a rapid exotherm occurred within 2 minutes. The data of Example 52B show that an analogous resin mixture containing $(mesitylene)_2Fe(SbF_6)_2$ was stable at room temperature for at least five weeks before slow cure started.

The data of Comparative Examples C25–C32 show that conventional Lewis acid catalysts must be used in higher concentrations than the organometallic salts disclosed in this invention. Additionally, epoxy mixtures containing this conventional Lewis acid catalyst were not stabilized by the additives in this invention under equivalent conditions used for the cationic organometallic salts.

Comparative Examples C33–C44

To compare the physical properties produced by different Lewis acid catalysts the following evaluations were performed. Tensile test samples were prepared as described in the tensile test sample preparation section using $Ph_3SSbF_6$ (CAT1), a triphenylsulfonium/phenylthiophenyldiphenylsulfonium hexafluoroantimonate salt from 3M Company, St. Paul, Minn., $CpFeXylSbF_6$ (CAT2), $SbF_5/DEG/SA21$ (CAT3), a 1/1/2.93 w/w/w mixture, and $Cp_2FeSbF_6$ (CAT4) as catalysts. Stock solutions were prepared from 30 g of Epon 828 and 0.035, 0.075 and 0.15 g of each catalyst. For CAT1 and CAT2, they were dissolved directly in the epoxy with heating in the dark. For formulations containing CAT3, the stabilized composition had to be used or the samples would cure before the tensile test samples could be prepared. For CAT4, an equivalent amount of gamma-butyrolactone was used to dissolve the catalyst before adding the epoxy.

Compositions containing CAT1 and CAT2 were photosensitive and were activated using 3 passes through a PPG Industries Model QC1202 UV Processor at 15.24 m/min (50 ft/min) with two lamps set at normal power giving an exposure of 100 mj/cm$^2$. The thermal cure cycle on all samples was one hour at 70° C. then 16 hours at 100° C. Tensile tests were preformed as described in the tensile test section. The results are presented in Table 34–36.

The data of Tables 34, 35, and 36 demonstrate that these Lewis acids 1) had different levels of activity when used at the same weight percentage, some were more effective than others at lower levels which would be more advantageous from a cost standpoint and 2) the same composition was useful to produce different physical properties when cured by these various Lewis acids. It has been shown that their activities were not the same and the cured composition exhibited different properties.

In sum, all Lewis acids are not equivalent and one cannot predict the usefulness of the stabilizing addition without extensive experimentation.

Various modifications and alterations of this invention will become apparent to those skilled in the art without departing from the scope and spirit of this invention, and it should be understood that this invention is not to be unduly limited to the illustrative embodiments set forth herein.

We claim:

1. An energy polymerizable composition comprising
    a) at least one cationically curable monomer selected from the group consisting of epoxy monomers and vinyl ether-containing monomers,
    b) a two-component initiator comprising

TABLE 34

| | | 0.12% Catalyst | | | |
|---|---|---|---|---|---|
| Comparative Example | Catalyst | Tensile, MPa | % Elongation | Energy at Break, N-m | Tan Modulus MPa |
| C33 | CAT1 | 24.3 | 5.7 | 0.11 | 677 |
| C34 | CAT2* | 2.1 | 203.4 | 0.22 | 2.4 |
| C35 | CAT3** | — | — | — | — |
| C36 | CAT4 | 76 | 10 | 0.60 | 1342 |

*samples not fully cured.
**samples did not cure, no test run.

TABLE 35

| | | 0.25% catalyst | | | |
|---|---|---|---|---|---|
| Comparative Example | Catalyst | Tensile, MPa | % Elongation | Energy at Break, N-m | Tan Modulus MPa |
| C37 | CAT1 | 20.22 | 4 | 0.06 | 676 |
| C38 | CAT2 | 45.6 | 5.3 | 0.18 | 1226 |
| C39 | CAT3* | — | — | — | — |
| C40 | CAT4 | 81.2 | 9 | 0.63 | 1329 |

*samples did not cure, no test run.

TABLE 36

| | | 0.5% catalyst | | | |
|---|---|---|---|---|---|
| Comparative Example | Catalyst | Tensile, MPa | Elongation % | Energy at Break, N-m | Tan Modulus MPa |
| C41 | CAT1 | 13 | 2.6 | 0.3 | 580 |
| C42 | CAT2 | 50.6 | 4.4 | 0.17 | 1464 |
| C43 | CAT3* | 36.1 | 19 | 0.57 | 836 |
| C44 | CAT4 | 71.8 | 9 | 0.66 | 1283 |

*samples not fully cured.

(1) at least one salt of an organometallic complex cation wherein said cation contains at least one carbon atom bonded to a transition metal atom, and (2) at least one stabilizing additive, or an active portion thereof, selected from the group consisting of classes 1 to 5:

wherein
Class 1 comprises compounds represented by formula III $$R^1-Z^1-R^1 \quad \text{(III)}$$

where $Z^1$ is a diradical moiety selected from the group consisting of

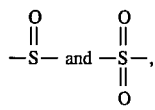

and each $R^1$ independently is a group selected from $C_1$ to $C_{10}$ alkyl groups and groups having 1 to 4 fused or unfused aromatic rings, and the $R^1$s together can form a heterocyclic ring having 5 to 7 ring atoms;

Class 2 comprises macrocyclic compounds represented by formula IV

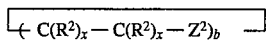

wherein $Z^2$ is a diradical —O—, —S—, or —NH—; wherein each $R^2$ independently can be hydrogen or it can be $R^1$ as previously defined, or two $R^2$s together can form at least one ring which is saturated or unsaturated and the ring can be substituted or unsubstituted with alkyl, alkenyl or alkynyl groups containing from 1 to 30 carbon atoms; the carbon atoms can be interrupted with up to 10 individual, non-catenated heteroatoms selected from O, S, and N;

x is 1 or 2, and b is an integer from 3 to 10;

Class 3 is represented by compounds having formulae V and VI,

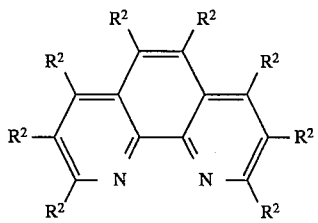

wherein each $R^2$ independently is as previously defined; and a class of tripyridyltriazines

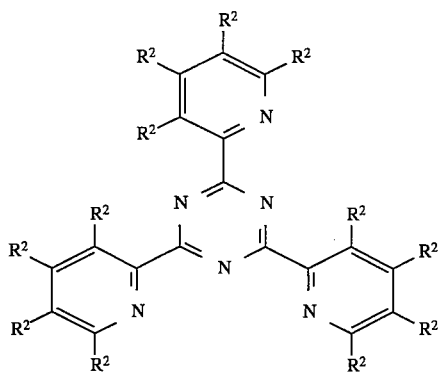

wherein each $R^2$ independently is as previously defined;

Class 4 is described by compounds of formula VII:

where $Z^3$ is nitrogen, phosphorus, arsenic or antimony; where each $R^1$ independently is as defined above, and $R^3$ can be $R^1$ or a difunctional group selected from alkylene and phenylene groups, wherein c is either 1 or 2;

Class 5 describes Schiff bases and can be represented by compounds of formula VIII:

wherein $R^2$ and $R^3$ independently are as previously defined, and wherein d is 1 or 2.

2. The composition according to claim 1 further comprising at least one mono or poly alcohol.

3. The composition according to claim 1 further comprising at least one additive to increase the speed of cure.

4. The composition according to claim 1 wherein said cationically curable monomer is at least one epoxy monomer.

5. The composition according to claim 1 wherein said cationically curable monomer is at least one vinyl ether-containing monomer.

6. The composition according to claim 1 wherein said salt of an organometallic complex cation has the formula

wherein

M is selected from the group containing Cr, Ni, Mo, W, Mn, Tc, Re, Fe, Ru, Os, Co, Rh and Ir;

$L^1$ represents none, one or two of the same or different ligands contributing pi-electrons that can be selected from aromatic compounds and heterocyclic aromatic compounds, and capable of contributing six pi-electrons to the valence shell of M;

$L^2$ represents none, one or two of the same or different ligands contributing pi-electrons that can be selected from cyclopentadienyl and indenyl anion groups, and capable of contributing six pi-electrons to the valence shell of M;

q is an integer having a value of 1 or 2, the residual charge of the complex cation;

y and z are integers having a value of zero, one, or two, provided that the sum of y and z is equal to 2;

X is an anion selected from organic sulfonate anions and halogen-containing complex anions of a metal or metalloid; and n is an integer having a value of 1 or 2, the number of complex anions required to neutralize the charge q on the complex cation.

7. The composition according to claim 1 wherein said salt is selected from the group consisting of bis-(eta $^6$-arene) iron complex cations and bis(eta$^5$-cyclopentadienyl)iron complex cations.

8. The composition according to claim 1 wherein said stabilizing additive used with bis-(eta$^6$-arene)iron complex cations has a formula selected from the group consisting of classes 1 to 3.

9. The composition according to claim 1 wherein said stabilizing additive used with bis-(eta$^5$-cyclopentadienyl)iron complex cations is selected from the group consisting of classes 2, 4, and 5.

10. The composition according to claim 1 wherein said stabilizing additive is said class 1 compound.

11. The composition according to claim 1 wherein said stabilizing additive is said class 2 compound.

12. The composition according to claim 1 wherein said stabilizing additive is said class 3 compound.

13. The composition according to claim 1 wherein said stabilizing additive is said class 4 compound.

14. The composition according to claim 1 wherein said stabilizing additive is said class 5 compound.

15. The cured composition according to claim 1.

16. The cured composition according to claim 2.

17. The cured composition according to claim 3.

18. A process comprising the steps:
   a) providing the curable composition according to claim 1, and
   b) adding sufficient energy to the composition in the form of at least one of heat and light in any combination and order to cure said composition.

19. An article having on at least one surface thereof a layer of the composition according to claim 1, said composition optionally further comprising abrasive particles.

20. The article according to claim 19 wherein said layer of the composition is an adhesive.

21. An article comprising a substrate having on at least one surface thereof a layer of the composition according to claim 15.

22. The article according to claim 21 wherein said layer of the compound is a protective coating.

23. An article comprising a substrate having on at least one surface thereof a layer of the composition according to claim 16.

24. An article comprising a substrate having on at least one surface thereof a layer of the composition according to claim 17.

25. A process comprising the steps:
   a) coating at least one surface of a substrate with a layer of the energy polymerizable composition according to claim 1, and
   b) supplying sufficient energy to the composition in the form of at least one of heat and light in any combination and order for a time sufficient to cure said composition.

* * * * *

UNITED STATES PATENT AND TRADEMARK OFFICE
CERTIFICATE OF CORRECTION

PATENT NO. : 5,494,943
DATED : February 27, 1996
INVENTOR(S) : Wayne S. Mahoney et al.

It is certified that error appears in the above-indentified patent and that said Letters Patent is hereby corrected as shown below:

Col. 1, lines 51-52, "(n6-arene)(n$^5$-cyclopentadienyl)iron(+1)" should read -- (n$^6$-arene)(n$^5$-cyclopentadienyl)iron(+1) --.

Col. 6, line 14, "Polymeric" should be -- polymeric --.

Col. 6, line 64, "polyvinylcarbazole L$^2$" should be -- polyvinylcarbazole. L$^2$ --.

Col. 7, line 60, at the end of the paragraph, add -- Preferred cations include bis(eta$^6$-arene)iron complex cations and bis(eta$^5$-cyclopentadienyl)iron complex cations. --

Col. 9, line 50, "bis" should read -- b is --.

Col. 23, line 35, "and g" should read -- and 200 g --.

Col. 23, line 40, "glycol Epon 828" should read -- glycol 400/Epon 828 --.

Col. 23, line 56, "glycol 400" should read -- glycol 400/ --.

Col. 24, line 21, "rum" should read -- run --.

Col. 24, line 32, "(Me3SiCp)2FeSbF$_6$" should read -- (Me$_3$SiCp)$_2$FeSbF$_6$ --.

Col. 26, line 66, "6 weeks of the" should read -- 6 weeks 49% of the --.

Col. 27, line 19, "Epon" should read -- Epon 828/ --.

UNITED STATES PATENT AND TRADEMARK OFFICE
CERTIFICATE OF CORRECTION

PATENT NO. : 5,494,943

DATED : February 27, 1996

INVENTOR(S) : Wayne S. Mahoney et al.

It is certified that error appears in the above-indentified patent and that said Letters Patent is hereby corrected as shown below:

Col. 30, line 13, "while only was" should read -- while only 28% was --.

Col. 32, line 60, "to g" should read -- to 100 g --.

Col. 33, line 57, "0,254" should be -- 0.254 --.

Col. 37, line 6, "Ph3SSbF$_6$" should be -- $Ph_3SSbF_6$ --.

Col. 39, line 38, "bis" should read -- b is --.

Signed and Sealed this

Third Day of September, 1996

BRUCE LEHMAN

Attest:

Attesting Officer

Commissioner of Patents and Trademarks

UNITED STATES PATENT AND TRADEMARK OFFICE
CERTIFICATE OF CORRECTION

PATENT NO. : 5,494,943
DATED : February 27, 1996
INVENTOR(S) : Wayne S. Mahoney et al.

It is certified that error appears in the above-indentified patent and that said Letters Patent is hereby corrected as shown below:

Col. 1, lines 51-52, "(n6-arene)(n$^5$-cyclopentadienyl)iron(+1)" should read -- (n$^6$-arene)(n$^5$-cyclopentadienyl)iron(+1) --.

Col. 6, line 14, "Polymeric" should be -- polymeric --.

Col. 6, line 64, "polyvinylcarbazole L$^2$" should be -- polyvinylcarbazole. L$^2$ --.

Col. 9, line 50, "bis" should read -- b is --.

Col. 23, line 35, "and g" should read -- and 200 g --.

Col. 23, line 40, "glycol Epon 828" should read -- glycol 400/Epon 828 --.

Col. 23, line 56, "glycol 400" should read -- glycol 400/ --.

Col. 24, line 21, "rum" should read -- run --.

Col. 24, line 32, "(Me3SiCp)2FeSbF$_6$" should read -- (Me$_3$SiCp)$_2$FeSbF$_6$ --.

Col. 26, line 66, "6 weeks of the" should read -- 6 weeks 49% of the --.

Col. 27, line 19, "Epon" should read -- Epon 828/ --.

UNITED STATES PATENT AND TRADEMARK OFFICE
CERTIFICATE OF CORRECTION

PATENT NO. : 5,494,943
DATED : February 27, 1996
INVENTOR(S) : Wayne S. Mahoney et al.

It is certified that error appears in the above-indentified patent and that said Letters Patent is hereby corrected as shown below:

Col. 30, line 13, "while only was" should read -- while only 28% was --.

Col. 32, line 60, "to g" should read -- to 100 g --.

Col. 33, line 57, "0,254" should be -- 0.254 --.

Col. 37, line 6, "Ph3SSbF$_6$" should be -- Ph$_3$SSbF$_6$ --.

Col. 39, line 38, "bis" should read -- b is --.

Col. 40, line 62, "claim 1" should be -- claim 7 --.

Col. 40, line 66, "claim 1" should be -- claim 7 --.

Signed and Sealed this

Fourth Day of March, 1997

Attest:

BRUCE LEHMAN

Attesting Officer

Commissioner of Patents and Trademarks